US010777578B2

(12) United States Patent
Liu

(10) Patent No.: US 10,777,578 B2
(45) Date of Patent: Sep. 15, 2020

(54) THREE-DIMENSIONAL MEMORY DEVICE AND MANUFACTURING METHOD THEREOF

(71) Applicant: NuStorage Technology Co., Ltd., Apia, AS (US)

(72) Inventor: Fu-Chou Liu, Hsin-Chu County (TW)

(73) Assignee: NUSTORAGE TECHNOLOGY CO., LTD., Apia (WS)

( * ) Notice: Subject to any disclaimer, the term of this patent is extended or adjusted under 35 U.S.C. 154(b) by 78 days.

(21) Appl. No.: 16/161,856

(22) Filed: Oct. 16, 2018

(65) Prior Publication Data

US 2019/0148406 A1  May 16, 2019

(30) Foreign Application Priority Data

Nov. 13, 2017  (CN) .......................... 2017 1 1114898

(51) Int. Cl.
*H01L 27/11582* (2017.01)
*H01L 27/11597* (2017.01)
*H01L 23/528* (2006.01)
*H01L 29/10* (2006.01)
*H01L 29/51* (2006.01)
(Continued)

(52) U.S. Cl.
CPC .. *H01L 27/11597* (2013.01); *H01L 21/31144* (2013.01); *H01L 23/528* (2013.01); *H01L 27/1159* (2013.01); *H01L 27/11587* (2013.01); *H01L 29/1037* (2013.01); *H01L 29/40111* (2019.08); *H01L 29/516* (2013.01);
(Continued)

(58) Field of Classification Search
CPC ......... H01L 27/11597; H01L 27/11587; H01L 27/1159; H01L 29/78391; H01L 29/40111; H01L 29/1037; H01L 29/516; H01L 29/517; H01L 29/6684; H01L 21/31144; H01L 23/528
See application file for complete search history.

(56) References Cited

U.S. PATENT DOCUMENTS 8,178,919 B2 * 5/2012 Fujiwara ........... H01L 27/11524
257/319
9,515,079 B2 * 12/2016 Koka ................... H01L 29/7883
(Continued)

*Primary Examiner* — Kyoung Lee
*Assistant Examiner* — Christina A Sylvia
(74) *Attorney, Agent, or Firm* — Li & Cai Intellectual Property (USA) Office

(57) ABSTRACT

A three-dimensional memory device and a manufacturing method thereof are provided. The three-dimensional memory device includes a plurality of bottom source lines extending in a first horizontal direction, a stacked structure disposed on the bottom source lines, a plurality of bit lines extending in a second horizontal direction, and a plurality of pillar structures passing through the stacked structure. The stacked structure includes a plurality of composite structures spaced apart from one another and respectively located at different levels. The composite structures each include a gate conductive layer and a ferroelectric layer surrounding the gate conductive layer. Each of the pillar structures connected between the corresponding bit line and the corresponding bottom source line includes a barrier layer, a gate insulating layer, and a channel layer. The ferroelectric layer of each composite structure is insulated from the gate insulating layer of the pillar structure by the barrier layer.

9 Claims, 21 Drawing Sheets

(51) Int. Cl.
  *H01L 27/11587* (2017.01)
  *H01L 29/78* (2006.01)
  *H01L 29/66* (2006.01)
  *H01L 27/1159* (2017.01)
  *H01L 21/311* (2006.01)
  *H01L 21/28* (2006.01)

(52) U.S. Cl.
  CPC ........ *H01L 29/517* (2013.01); *H01L 29/6684* (2013.01); *H01L 29/78391* (2014.09)

(56) References Cited

U.S. PATENT DOCUMENTS

| | | | |
|---|---|---|---|
| 2012/0104484 A1* | 5/2012 | Lee | H01L 45/1233 |
| | | | 257/324 |
| 2018/0265967 A1* | 9/2018 | Lei | H01L 21/02219 |
| 2019/0123061 A1* | 4/2019 | Liu | G11C 11/2273 |
| 2020/0075629 A1* | 3/2020 | Park | H01L 29/0847 |

* cited by examiner

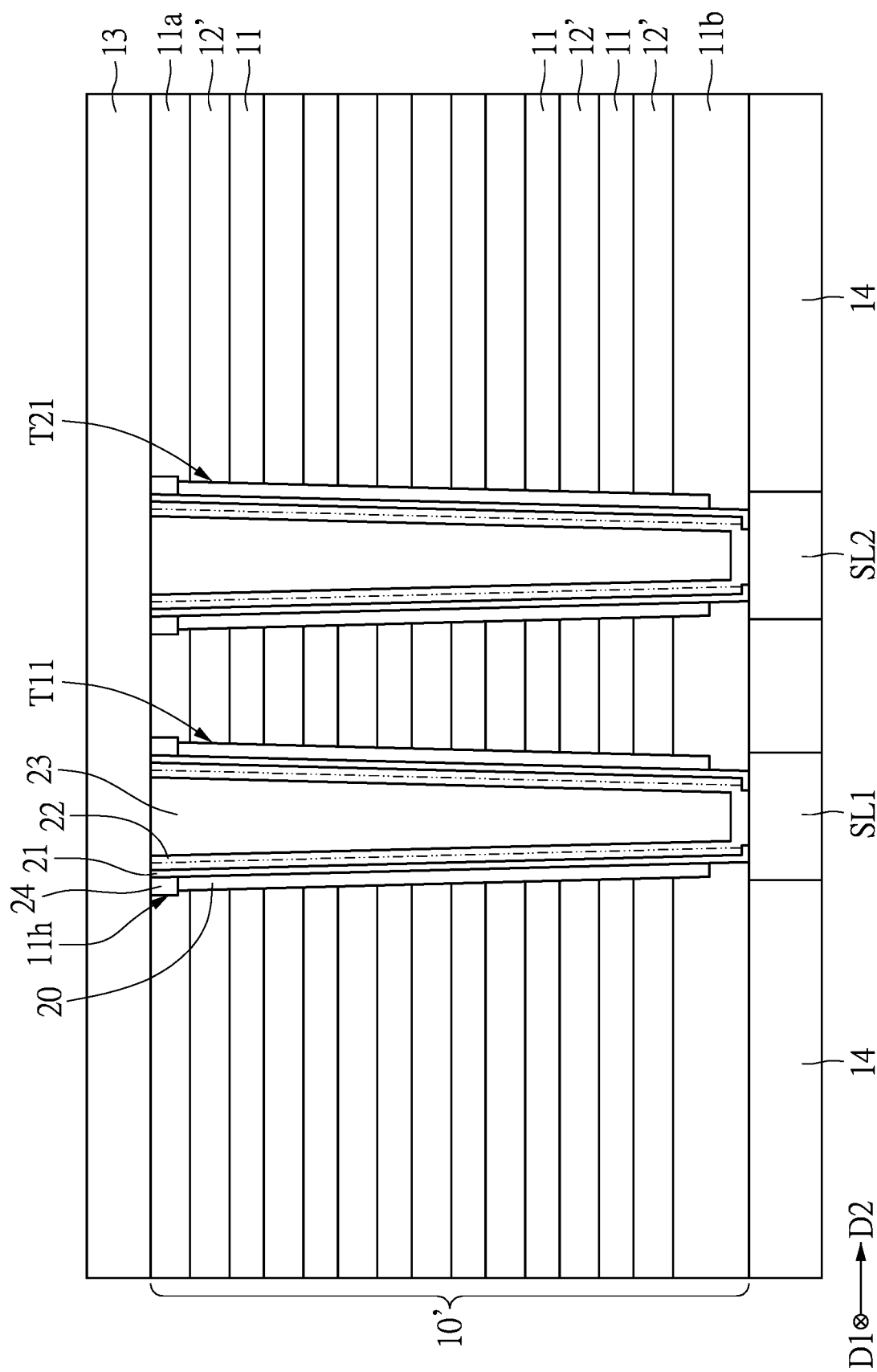

THREE-DIMENSIONAL MEMORY DEVICE AND MANUFACTURING METHOD THEREOF

CROSS-REFERENCE TO RELATED PATENT APPLICATION

This application also claim the priority benefit of a prior application serial no. CN 201711114898.5 filed Nov. 13, 2017. The entirety of the aforementioned patent applications is hereby incorporated by reference herein and made a part of this specification.

FIELD OF THE DISCLOSURE

The disclosure relates to a three-dimensional memory device and manufacturing method thereof in particular, to a vertical three-dimensional memory device and manufacturing method thereof.

BACKGROUND OF THE DISCLOSURE

With recent evolvement of electronic devices, it has become a trend to develop memory devices having larger data storage capacity. In order to save data after the power is turned off, non-volatile memories, such as flash memory or ferroelectric random access memory (Fe-RAM), have received more attention. However, in order to process high-speed and large-capacity data, it is necessary to further develop a memory device which operates faster and has larger data storage capacity.

Furthermore, the ferroelectric material used in a conventional memory device is usually a material having a perovskite structure. A thickness of the ferroelectric material layer having the perovskite structure has to be greater than 200 nm to allow the ferroelectric material layer to exhibit a ferroelectric characteristic, so that the size of a ferroelectric field effect transistor (FeFET) is difficult to be reduced.

However, to replace the material having the perovskite structure with other ferroelectric materials, it is necessary to ensure that the ferroelectric characteristic of the ferroelectric material is unaffected during the fabrication processes or remains unchanged with increase of usage time, otherwise writing, reading and storing of data may be affected. Accordingly, the conventional memory device leaves room for improvement.

SUMMARY OF THE DISCLOSURE

The present disclosure is to provide a three-dimensional memory device and a manufacturing method thereof, in which the three-dimensional memory device includes vertically stacked memory cells so as to have higher data storage capacity.

In order to achieve the aforementioned objects, according to an embodiment of the disclosure, a three-dimensional memory device is provided. The three-dimensional memory device includes a plurality of bottom source lines, a stacked structure, a plurality of bit lines, and a plurality of pillar structures. The bottom source lines extend in a first horizontal direction. The stacked structure is disposed on the bottom source lines and includes a plurality of composite structures which are spaced apart from one another and respectively located at different levels. Each of the composite structures includes a gate conductive layer and a ferroelectric layer surrounding the gate conductive layer. The bit lines are disposed on the stacked structure and extend in a second horizontal direction, and the bit lines traverse the bottom source lines. Each of the pillar structures passes through the stacked structure and is connected between the corresponding bit line and the corresponding bottom source line. Each of the composite structures and the corresponding one of the pillar structures define a memory cell. Each of the pillar structures includes a barrier layer, a gate insulating layer, and a channel layer, and each of the ferroelectric layers and the corresponding one of the gate insulating layers are insulated from each other by the corresponding one of the barrier layers.

According to another embodiment of the disclosure, a manufacturing method of a three-dimensional memory device is provided. In the manufacturing method, a plurality of bottom source lines extending in a first horizontal direction are formed. Subsequently, an initial stacked structure on the bottom source lines is formed, in which the initial stacked structure includes a plurality of insulating layers and a plurality of interlayers which are alternately stacked. Thereafter, a plurality of pillar structures passing through the initial stacked structure are formed, in which each of the pillar structures corresponds to at least one of the bottom source lines and includes a barrier layer, a gate insulating layer, and a channel layer. Thereafter, the interlayers of the initial stacked structure are removed, in which the insulating layers and the pillar structures jointly define a plurality of spaces, and each of the spaces being defined by two adjacent insulating layers and the corresponding pillar structure. A plurality of composite structures are formed respectively in the spaces, in which each of the composite structures includes a gate conductive layer and a ferroelectric layer surrounding the gate conductive layer, and the ferroelectric layer is isolated from the gate insulating layer by the barrier layer. A plurality of bit lines extending in a second horizontal direction are formed on the stacked structure, in which each of the pillar structures is connected between the corresponding bit line and the corresponding bottom source line.

In the three-dimensional memory device and manufacturing method thereof provided in the embodiments of the present disclosure, each of the pillar structure includes the barrier layer, the gate insulating layer, and the channel layer, and the ferroelectric layer is isolated from the gate insulating layer by the barrier layer. As such, in the manufacturing processes of the three-dimensional device, the barrier layer can prevent atoms in the gate insulating layer from diffusing into the ferroelectric layer, and thus influence on the ferroelectric characteristic of the ferroelectric layer, which is induced by the atoms diffusing from the gate insulating layer, is avoided. In addition, the three-dimensional memory device includes a plurality of memory cells which are vertically stacked and serially connected. As a result, the data storage capacity per unit area is increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which:

FIG. 6A is a partial sectional view of the three-dimensional memory device in step S103 of FIG. 3.

DETAILED DESCRIPTION OF THE EXEMPLARY EMBODIMENTS

Figure 1:
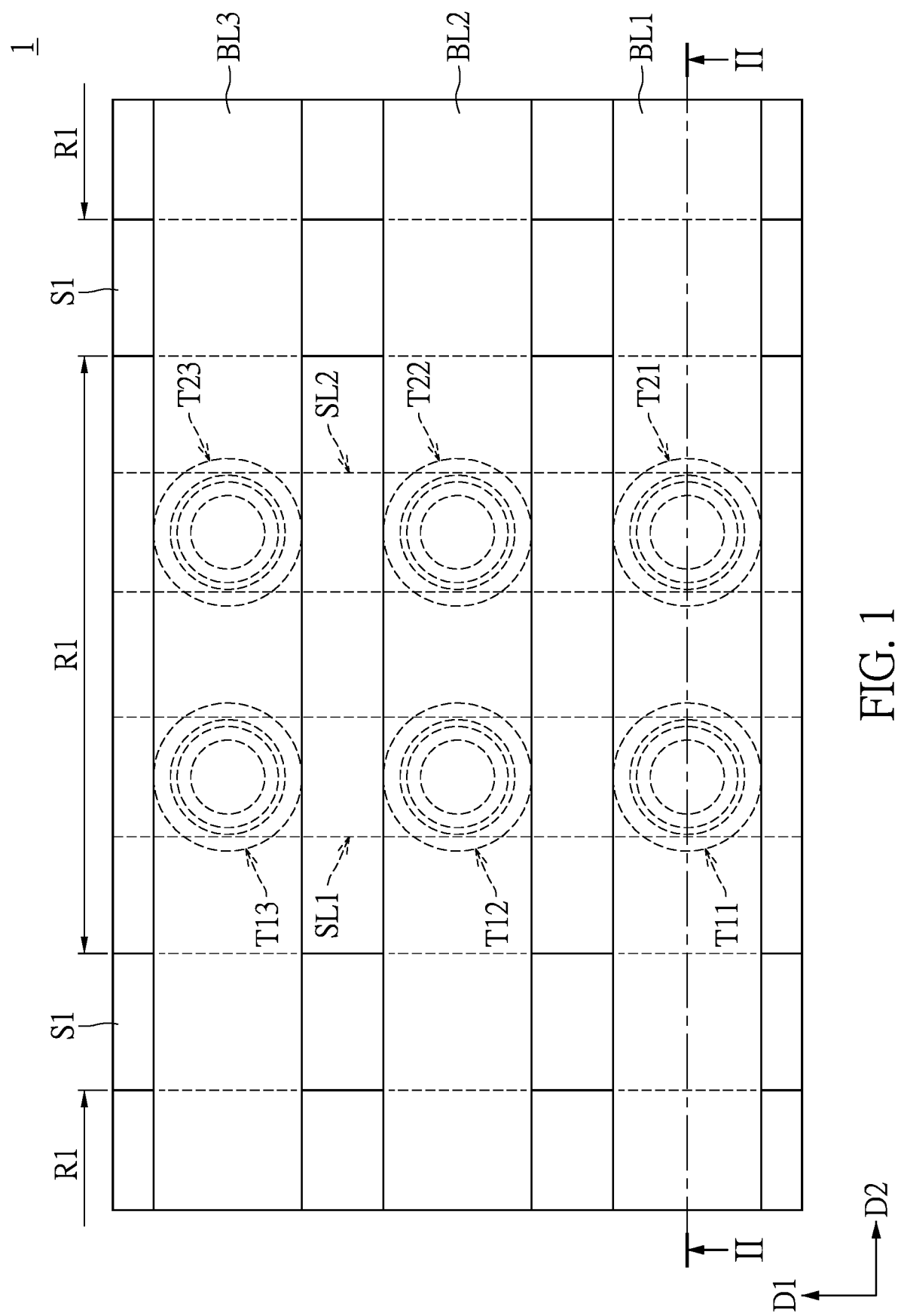
FIG. 1 is a partial top view of a three-dimensional memory device according to an embodiment of the present disclosure.
Figure 2:
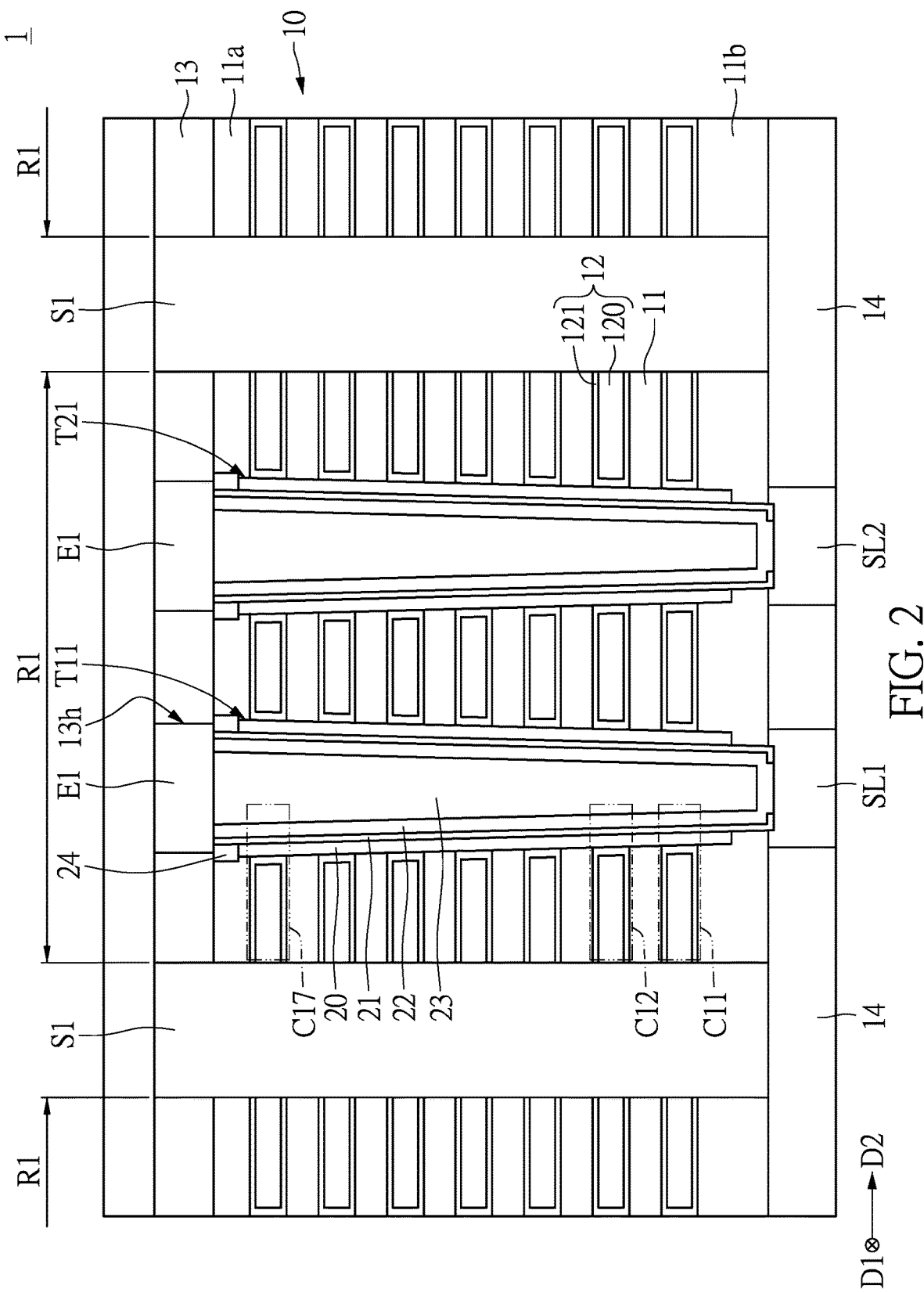
FIG. 2 is a partial sectional view taken along line II-II of FIG. 1.

Referring to FIG. 1 to FIG. 2, FIG. 1 is a partial top view of a three-dimensional memory device according to an embodiment of the present disclosure, and FIG. 2 is a partial sectional view taken along line II-II of FIG. 1.

A three-dimensional memory device 1 in the embodiment of the present disclosure includes a plurality of bottom source lines SL1-SL2, a stacked structure 10, a plurality of bit lines BL1-BL3, and a plurality of pillar structures T11-T23.

The bottom source lines SL1-SL2 extend in a first horizontal direction D1 and are arranged in parallel. As shown in FIG. 1, the bottom source lines SL1-SL2 in the present embodiment are arranged in parallel along a second horizontal direction D2. Furthermore, the bottom source lines SL1-SL2 are disposed on another substrate (not shown in FIG. 1) and spaced from each other. In one embodiment, the three-dimensional memory device 1 further includes a plurality of insulating portions 14, and each of the insulating portions 14 is disposed between two adjacent bottom source lines SL1-SL2, so that the two adjacent bottom source lines SL1-SL2 are insulated from each other. In one embodiment, the bottom source lines SL1-SL2 can be made of semiconductor heavily doped with impurities of N-type or P-type conductivity, for example, heavily-doped polysilicon.

Furthermore, the stacked structure 10 is disposed on the bottom source lines SL1-SL2. Reference is made to FIG. 1. The stacked structure 10 includes a plurality of cell regions R1 and a plurality of isolation portions S1, and two adjacent cell regions R1 are spaced apart from each other by one of the isolation portion S1. It should be noted that FIG. 1 only shows one cell region R1 and two isolation portions S1 for illustration. As shown in FIG. 1, two isolation portions S1 are respectively located at two opposite sides of the cell region R1 to define the range of the cell region R1. In the embodiment, the isolation portions S1 can be made of an insulation material, and each of the isolation portions S1 extends from the top surface to the bottom surface of the stacked structure 10.

Reference is made to FIG. 2. In the embodiment, the stacked structure 10 includes a plurality of insulating layers 11 and a plurality of composite structures 12, in which the composite structures 12 are respectively located at different levels and spaced apart from one another.

Specifically, the composite structures 12 and the insulating layers 11 are alternately stacked in a vertical direction. That is to say, any two adjacent composite structures 12 are spaced apart from each other by one of the insulating layers 11. To be more specific, each of the composite structures 12 is arranged in a space defined by two adjacent insulating layers 11. Furthermore, each of the composite structures 12 includes a gate conductive layer 120 and a ferroelectric layer 121 surrounding the gate conductive layer 120.

It should be noted that the gate conductive layers 120 which are respectively located at different levels can serve as word lines of the three-dimensional memory device 1. That is to say, by applying read voltages, write voltages or erase voltages to the gate conductive layers 120 which are located at different levels, the three-dimensional memory device 1 can be read or written. In one embodiment, the gate conductive layers 120 can be made of titanium nitride, tantalum nitride, tungsten nitride, iridium, platinum, palladium or any combination thereof.

Each of the ferroelectric layers 121 surrounds the corresponding one of the gate conductive layers 120. The material of the ferroelectric layer 121 includes a ferroelectric material and dopants. The ferroelectric material can be hafnium oxide, hafnium zirconium oxide, hafnium silicon oxide, or zirconium titanium oxide, and the dopants can be silicon, aluminum, lanthanum, yttrium, strontium, gadolinium, niobium, nickel, tantalum, or any combination thereof. The direction of the resultant electric dipole moment of the ferroelectric layer 121, i.e., the polarization direction, may be changed according to a voltage applied to the corresponding one of the gate conductive layer 120.

Reference is made to FIG. 1 again. A plurality of bit lines BL1-BL3 extending in a second horizontal direction D2 are disposed on the stacked structure 10 and arranged in parallel along the first horizontal direction D1. Accordingly, the bit lines BL1-BL3 traverse the bottom source lines SL1-SL2. As shown in the top view of FIG. 1, an intersection is formed between each of the bit lines BL1-BL3 and each of the bottom source lines SL1-SL2. These intersections are arranged in an array. In the embodiment, the bottom source lines SL1-SL2 and the bit lines BL1-BL3 are both made of heavily-doped semiconductors. In one embodiment, the bottom source lines SL1-SL2 and the bit lines BL1-BL3 are both made of polysilicon heavily doped with impurities of N-type or P-type conductivity.

Furthermore, a plurality of pillar structures T11-T23 pass through the stacked structure 10, and each of the pillar structures T11-T23 is connected between the corresponding one of the bit lines BL1-BL3 and the corresponding one of the bottom source lines SL1-SL2. As shown in FIG. 1, the pillar structures T11-T23 respectively correspond to the intersections and pass through the stacked structure 10. Moreover, the cell regions R1 each have the plurality of the pillar structures T11-T23 located therein. In the embodiment shown in FIG. 1, six (2 by 3) pillar structures T11-T23 are located in the cell region R1. The number of the pillar structures T11-T23 can be determined according to the number of the bottom source lines (two bottom source lines SL1-SL2 are shown in FIG. 1) passing across the cell region R1, and the number of the bit lines BL1-BL3 (three bit lines are shown in FIG. 1) passing across the cell region R1.

However, the number of the pillar structures T11-T23 in each cell region R1 can be adjusted according to practical demands, and the scope of the disclosure is not limited to that of the example provided herein. The number of the pillar structures in each cell region R1 can be increased by increasing the number of the bottom source lines SL1-SL2 passing across the cell region R1 or the number of the bit lines BL1-BL3 passing across the cell region R1 so as to increase the number of the intersections defined by the bottom source lines SL1-SL2 and the bit lines BL1-BL3.

Referring to FIG. 2, each of the pillar structures T11-T23 passes through the composite structures 12 stacked in the vertical direction (Z-direction). Between the composite structures 12 which are stacked vertically and one of the pillar structures T11-T23 which passes through them, a plurality of memory cells C11-C17 which are serially connected are formed. In other words, in one of the cell regions R1, each of the composite structures 12 and the corresponding pillar structure (for example, the pillar structure T11) define one of the memory cells C11-C17. Accordingly, by controlling voltages applied to the gate conductive layers 120, voltages applied to the corresponding bottom source lines SL1-SL2, and voltages applied to the corresponding bit lines BL1-BL3, respectively, the data can be written into or read from the selected one of the memory cells C11-C17.

Referring to FIG. 2, it should be noted that the ferroelectric layer 121 of each of the composite structures 12 conformingly covers a part of the side surface of the corresponding one of the pillar structures T11-T23, an upper surface of one of the insulating layers 11, and a lower surface of another one of the insulating layers 11.

Furthermore, as shown in FIG. 2, each of the pillar structures T11-T23, from the outside to the inside, sequentially includes a barrier layer 20, a gate insulating layer 21, a channel layer 22, and a core insulation column 23.

In the embodiment of the present disclosure, the outermost layer of each of the pillar structures T11-T33 is the barrier layer 20. Accordingly, the ferroelectric layer 121 and the gate insulating layer 21 are isolated from each other by the barrier layer 20. Furthermore, the material of the barrier layer 20 is a conductive material, such as titanium nitride, tantalum nitride, tungsten nitride, iridium, platinum, palladium or any combination thereof. In another embodiment, the material of the barrier layer 20 is heavily-doped semiconductor. Accordingly, in the three-dimensional memory device 1 of the embodiment of the present disclosure, the barrier layer 20 can serve as a floating gate of any one of the memory cells C11-C17.

Accordingly, in one embodiment, when the barrier layer 20 is made of a conductive material, the barrier layer 20 is insulated from both the corresponding one of the bottom source lines SL1-SL2 and the corresponding one of the bit lines BL1-BL3. To be more specific, in the embodiment, each of the pillar structures T11-T23 further includes a loop-shaped insulating portion 24 to isolate the barrier layer 20 from the corresponding one of the bit lines BL1-BL3.

As shown in FIG. 2, each loop-shaped insulating portion 24 is located at one end, which is closer to the bit lines BL1-BL3, of the corresponding one of the pillar structures T11-T23. The loop-shaped insulating portion 24 is arranged between the barrier layer 20 and the corresponding one of the bit lines BL1-BL3.

As shown in FIG. 2, the gate insulating layer 21 is interposed between the channel layer 22 and the barrier layer 20, and the channel layer 22 is interposed between the gate insulating layer 21 and the core insulation column 23. In one embodiment, the material of the gate insulating layer 21 can be silicon nitride, silicon oxide, or the combination thereof, and the material of the channel layer 22 can be lightly-doped polysilicon. Specifically, the material of the channel layer 22 usually has the conductivity type opposite to the conductivity type of the material of the bit line BL1-BL3 (and the bottom source line SL1-SL2). For example, when the material of the channel layer 22 is P-type semiconductor, the material of the bit lines BL1-BL3 (and the bottom source line SL1-SL2) is N-type semiconductor.

Accordingly, in the three-dimensional memory device 1 of the present disclosure, each of the memory cells C11-C17 has a metal-ferroelectric layer-metal-insulator-semiconductor, i.e., MFMIS, structure.

Furthermore, it should be noted that if atoms in the gate insulating layer 21 or channel layer 22 diffuse into the ferroelectric layer 121, the ferroelectric characteristic of the ferroelectric layer 121 are likely to be affected. For example, when the material of the ferroelectric layer 121 is hafnium oxide doped with silicon, the silicon concentration of the ferroelectric layer 121 has to fall within a predetermined range in order for the ferroelectric layer 121 to have a better ferroelectric characteristic. If silicon atoms in the gate insulating layer 21 or in the channel layer 22 diffuse into the ferroelectric layer 121 during the fabrication processes or the operation procedures, the silicon concentration of the ferroelectric layer 121 would be changed so that the ferroelectric characteristic of the ferroelectric layer 121 may not be as anticipated As such, data retention of the three-dimensional memory device 1 may be negatively affected as well. Accordingly, the ferroelectric layer 121 of the embodiment is isolated from the gate insulating layer 21 and the channel layer 22 by the barrier layer 22 to prevent atoms of the gate insulating layer 21 or the channel layer 22 from diffusing into the ferroelectric layer 121, and thus influence on the ferroelectric characteristic of the ferroelectric layer 121 is avoided.

Reference is made to FIG. 2. The channel layer 22 is electrically connected between the corresponding one of the bottom source lines SL1-SL2 and the corresponding one of the bit lines BL1-BL3. In the embodiment, the three-dimensional memory device 1 further includes a dielectric layer 13 disposed on the stacked structure 10. The dielectric layer 13 is in contact with the bit lines BL1-BL3, and the dielectric layer 13 has a plurality of openings 13h respectively corresponding to the pillar structures T11-T23. Furthermore, each of the bit lines BL1-BL3 includes a plurality of conductive portions E1, and the conductive portions E1 are respectively filled in the openings 13h to be electrically connected to the channel layers 22 of the corresponding pillar structures T11-T23, respectively.

However, in other embodiments, the dielectric layer 13 can be omitted. In this situation, the bit lines BL1-BL3 can be directly disposed on the top insulating layer 11a of the insulating layers 11 to be electrically connected to the channel layers 22 of the corresponding pillar structures T11-T23.

Accordingly, during operation of the three-dimensional memory device 1, by applying the voltages to gate conductive layers 120, the corresponding one of the bottom source lines SL1-SL2, and the corresponding one of the bit lines BL1-BL3, the write states of the memory cells C11-C17 can be controlled.

Specifically, the direction of the resultant electric dipole moment of the ferroelectric layer 121 in one of the composite structures 12, i.e., the polarization direction of the ferroelectric layer 121, may be changed according to a write voltage applied to the corresponding gate conductive layer 120. Since the polarization direction of the ferroelectric layer 121 determines the resistance or the conductance of the channel layer 22, a voltage that is equal to or greater than a threshold voltage is applied to the corresponding gate conductive layer 120 to change the resistance of the channel layer 22, and thereby to change the write state of one of the memory cells C11-C17. Subsequently, by measuring the current of the channel layer 22, the write state (such as "1" or "0") of the selected memory cell can be determined.

One of the memory cells C11-C17 shown in FIG. 2 is selected as an example to explain the operation principle of the three-dimensional memory device 1 of the embodiment in the present disclosure. In addition, assuming that the material of the channel layer 22 is P-type semiconductor, and the material of the bit lines BL1-BL3 (and the bottom source lines SL1-SL3) is N-type semiconductor. In this situation, when a positive bias, which is sufficient for changing the polarization direction of the ferroelectric layer 121, is applied to the corresponding gate conductive layer 120, the polarization direction of the ferroelectric layer 121 facilitates electrons to easily accumulate in the channel layer 22, such that the selected one of the memory cells C11-C17 is set in a first state with better conductivity.

Furthermore, when a negative bias, which is sufficient to change the polarization direction of the ferroelectric layer 121, is applied to the corresponding gate conductive layer 120, the polarization direction of the ferroelectric layer 121 facilitates electron holes to be formed in the channel layer 22, such that the selected one of the memory cells C11-C17 is set in a second state with poor conductivity.

When reading the three-dimensional memory device 1, the write states of the memory cells C11-C17 can be determined by measuring the total current of the channel layer 22. Specifically, by controlling the voltages respectively applied to the gate conductive layers 120, the voltage applied to the corresponding one of the bottom source lines SL1-SL2 and the voltage applied to the corresponding one of the bit lines BL1-BL3, the total current of the channel layer 22 can be measured. When the selected one of the memory cells C11-C17 is in the first state of better conductivity, the measured total current would be greater than a predetermined value. On the contrary, when the selected one of the memory cells C11-C17 is in the second state of poor conductivity, the measured total current would be lower than the predetermined value. In one embodiment, the first state can be defined as "1", and the second state can be defined as "0".

It should be noted that when one of the memory cells C11-C17 is selected, and a read voltage is applied to the gate conductive layer 120 corresponding to the selected one of the memory cells C11-C17, the read voltage is usually less than the threshold voltage to prevent the polarization direction of the ferroelectric layer 121 from being disturbed. The aforementioned threshold voltage refers to the minimum voltage for changing the polarization direction of the ferroelectric layer 121.

Figure 3:
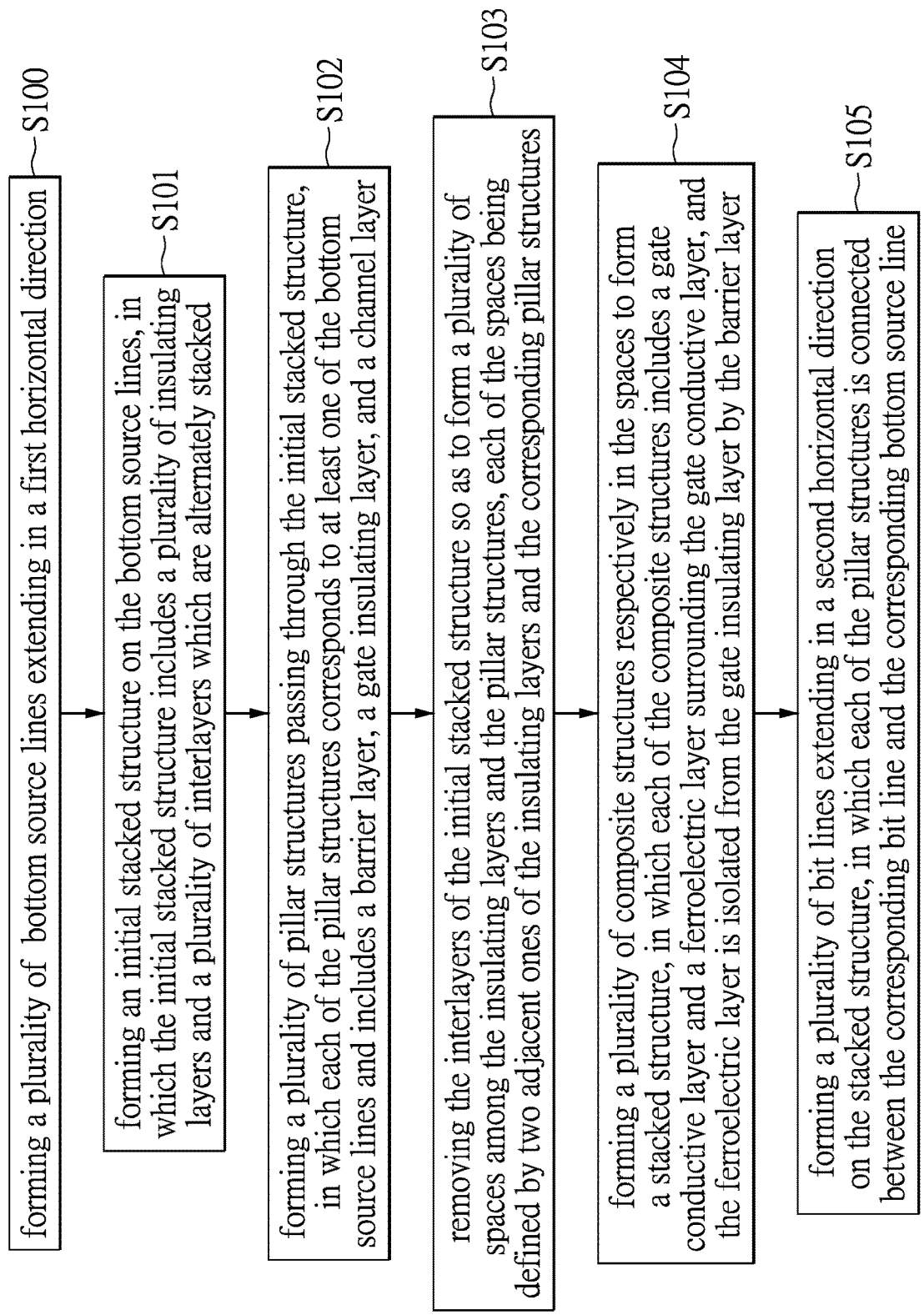
FIG. 3 is a flowchart of a manufacturing method of a three-dimensional memory device according to an embodiment of the present disclosure.

Subsequently, referring to FIG. 3, FIG. 3 is a flowchart of a manufacturing method of a three-dimensional memory device according to an embodiment of the present disclosure. In step S100, a plurality of bottom source lines extending in a first horizontal direction are formed. In step S101, an initial stacked structure is formed on the bottom source lines, in which the initial stacked structure includes a plurality of insulating layers and a plurality of interlayers. The insulating layers and interlayers are alternately stacked.

In step S102, a plurality of pillar structures passing through the initial stacked structure are formed. Each of the pillar structures corresponds to at least one of the bottom source lines and includes a barrier layer, a gate insulating layer, and a channel layer.

In step S103, the interlayers of the initial stacked structure are removed so as to form a plurality of spaces among the insulating layers and the pillar structures, each of the spaces being defined by two adjacent ones of the insulating layers and the neighboring pillar structure.

In step S104, a plurality of composite structures is respectively formed in the spaces to form a stacked structure. Each of the composite structures includes a gate conductive layer and a ferroelectric layer surrounding the gate conductive layer, and the ferroelectric layer is isolated from the gate insulating layer by the barrier layer. In step S105, a plurality of bit lines extending in a second horizontal direction are formed on the stacked structure, in which each of the pillar structures is connected between the corresponding bit line and the corresponding bottom source line.

Figure 4:
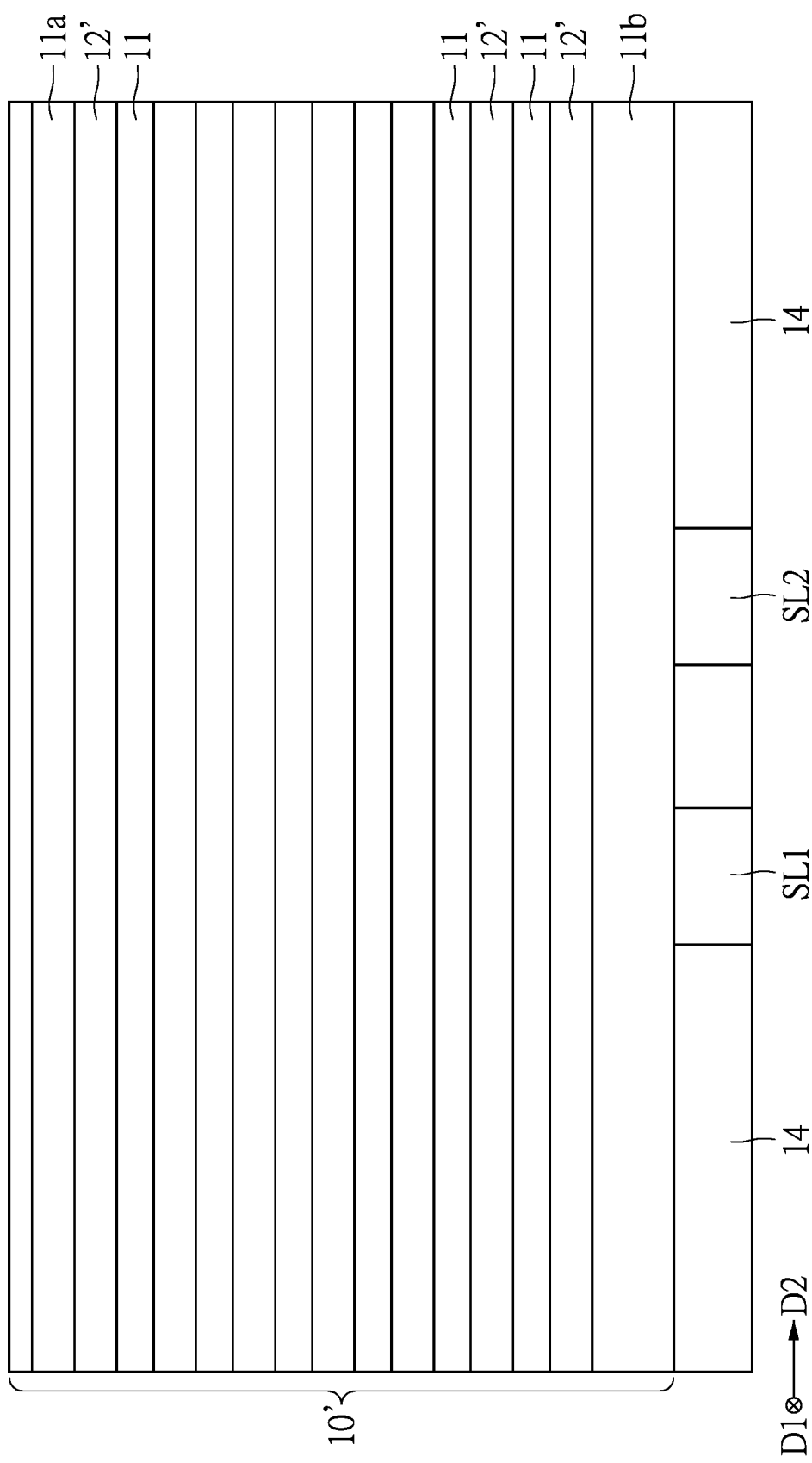
FIG. 4 is a partial sectional view of the three-dimensional memory device in step S101 of FIG. 3.

The details and the processes of the manufacturing method of the three-dimensional memory device according to an embodiment of the present disclosure will be further described in the following description. Reference is made to FIG. 4, which is a partial sectional view of the three-dimensional memory device in step S101 of FIG. 3. The bottom source lines SL1-SL2 extend in the first horizontal direction D1 and are arranged in parallel along a second horizontal direction D2.

Furthermore, in the step of forming the bottom source lines SL1-SL2, the manufacturing method of the three-dimensional memory device according to an embodiment of the present disclosure further includes a step of forming a plurality of insulating portions 14, each of which is disposed between two adjacent bottom source lines SL1-SL2 so that the two adjacent bottom source lines SL1-SL2 are insulated from each other. In one embodiment, the bottom source lines SL1-SL2 are disposed on another substrate (not shown in the drawings). In addition, the bottom source lines SL1-SL2 are made of a conductive material, such as heavily-doped polysilicon.

Subsequently, an initial stacked structure 10' is formed on the bottom source lines SL1-SL2. As shown in FIG. 4, the initial stacked structure 10' includes the insulating layers 11 and interlayers 12'. The insulating layers 11 and the interlayers 12' are stacked alternately. In the embodiment of the present disclosure, the material of the insulating layers 11 is different from that of the interlayers 12'. Furthermore, compared to the insulating layers 11, the interlayers 12' can have a high etching selectivity. For example, the material of the interlayers 12' can be silicon nitride, and the material of the insulating layers 11 can be silicon oxide.

Furthermore, it should be noted that both of the top layer and the bottom layer of the initial stacked structure 10' are insulating layers 11. That is to say, the insulating layers 11 includes a bottom insulating layer 11b located at the bottom side of the initial stacked structure 10', and a top insulating layer 11a located at the top side of the initial stacked structure 10'. The interlayers 12' are interposed between the top insulating layer 11a and the bottom insulating layer 11b.

Figure 5A:
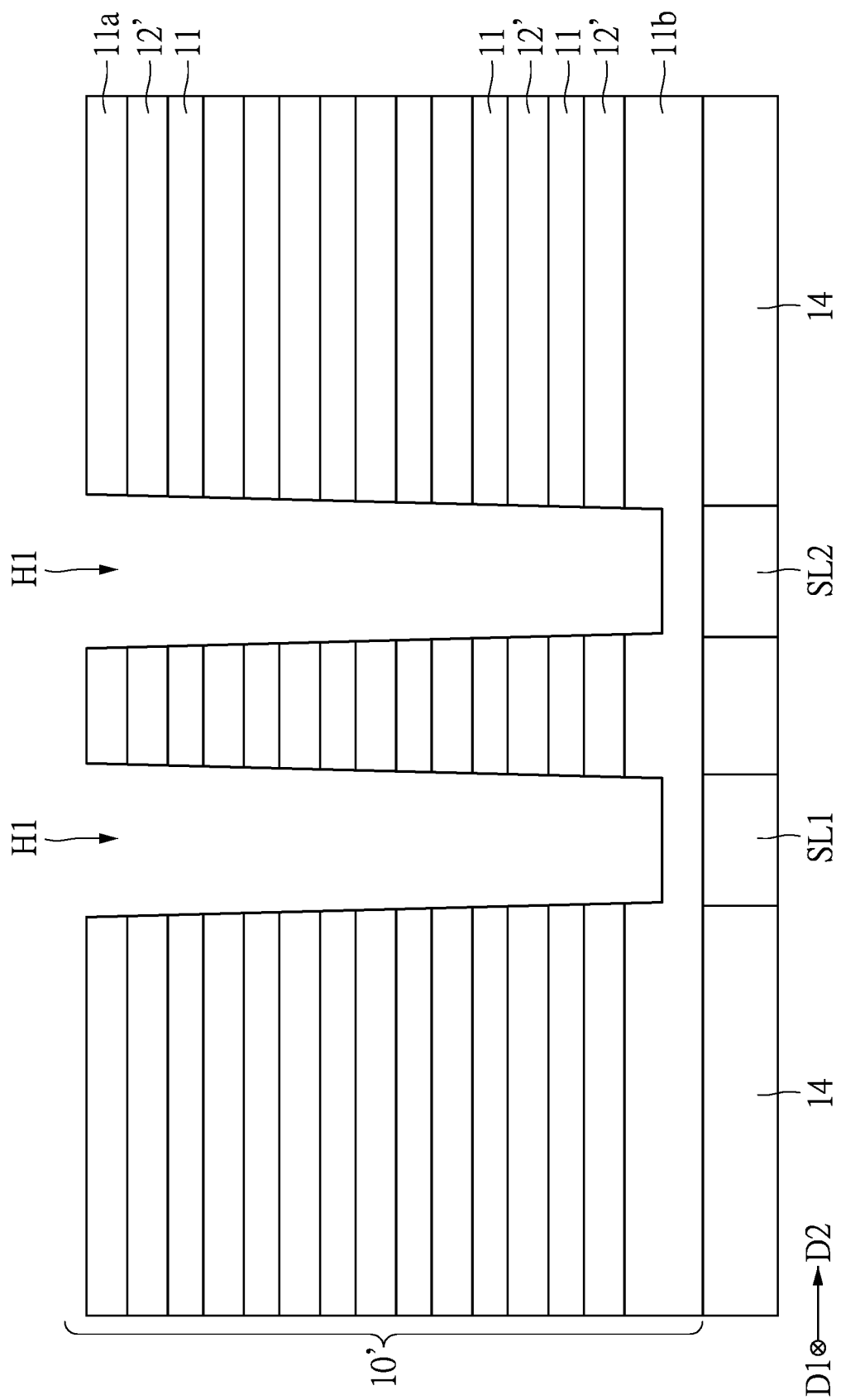
FIG. 5A is a partial sectional view of the three-dimensional memory device in step S102 of FIG. 3.
Figure 5B:
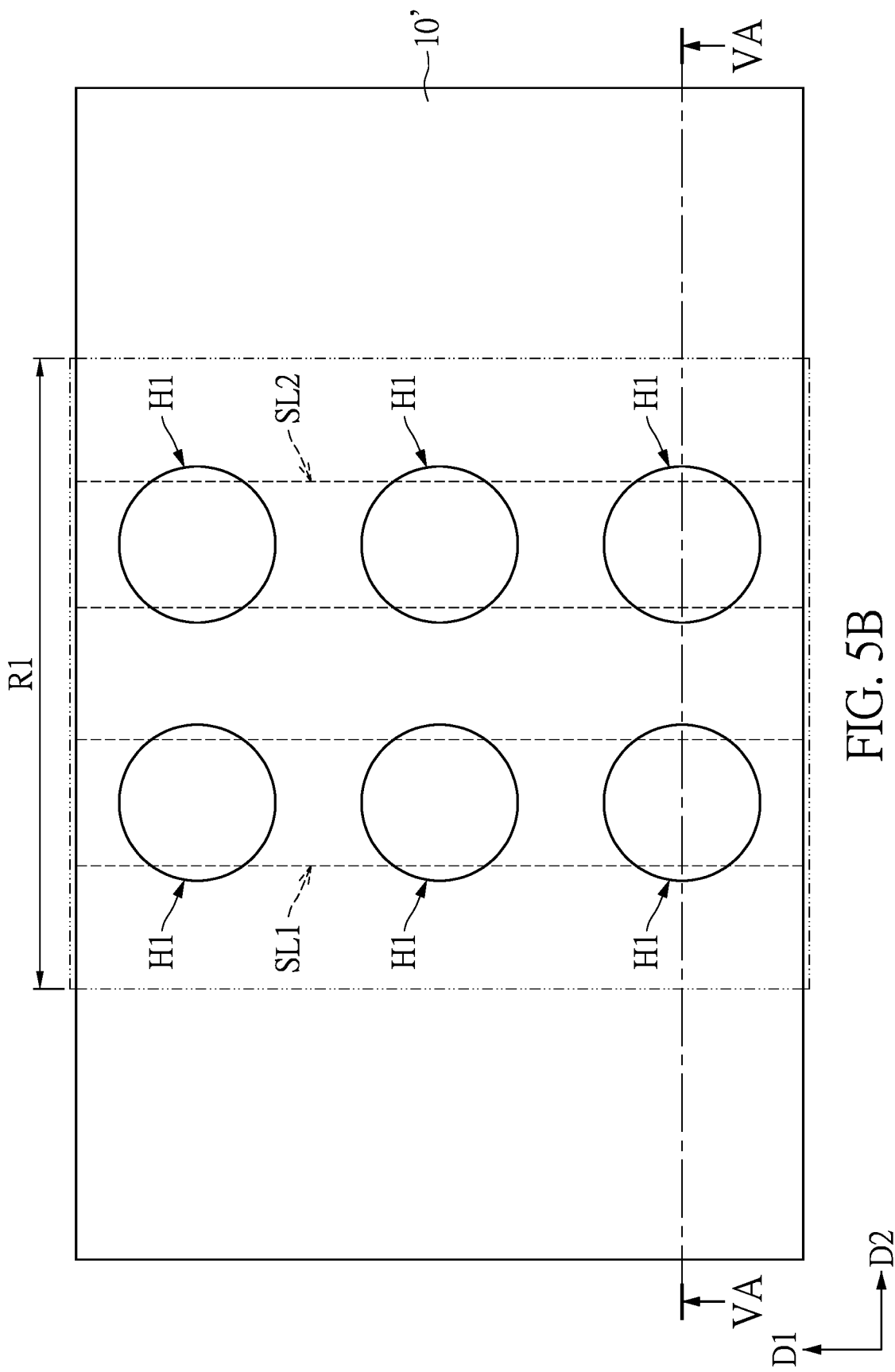
FIG. 5B is a partial top view of the three-dimensional memory device in step S102 of FIG. 3.

Subsequently, the details of the step S102 in FIG. 3 will be described. Reference is made to FIG. 5A and FIG. 5B. FIG. 5A is a partial sectional view of the three-dimensional memory device in step S102 of FIG. 3, and FIG. 5B is a partial top view of the three-dimensional memory device in step S102 of FIG. 3.

To be more specific, a plurality of pillar-shaped openings H1 which are separate from one another are formed in the initial stacked structure 10'. It should be noted that in the present embodiment, the initial stacked structure 10' has been divided into a plurality of cell regions R1, and each of the cell regions R1 has the pillar-shaped openings H1 formed therein and spaced apart from one another. In the embodiment of FIG. 5A and FIG. 5B, the pillar-shaped openings H1 in only one of the cell regions R1 is illustrated.

As shown in FIG. 5B, each of the pillar-shaped openings H1 corresponds to one of the bottom source lines SL1-SL2. In other words, on each of the bottom source lines SL1-SL2, a number of the pillar-shaped openings H1 have been formed. Furthermore, referring to FIG. 5A, each of the pillar-shaped openings H1 extends from a top surface of the initial stacked structure 10' to the bottom insulating layer 11b so that each of the interlayers 12' is exposed from an inner sidewall surface of the corresponding pillar-shaped opening H1.

Figure 5C:
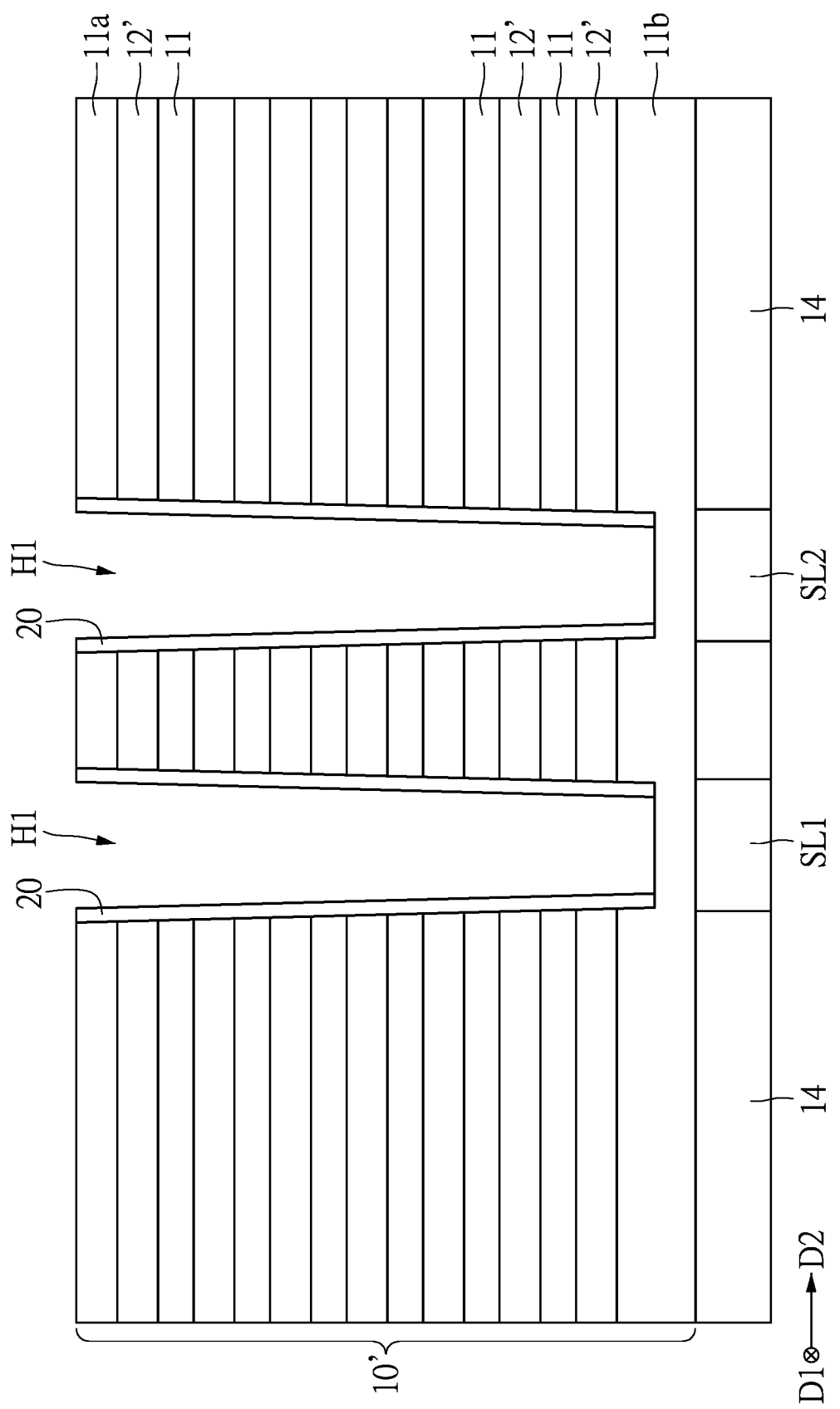
FIG. 5C is a partial sectional view of the three-dimensional memory device in step S102 of FIG. 3.

Reference is made to FIG. 5C. Subsequently, a barrier layer 20 is formed on the inner sidewall surface of each of the pillar-shaped openings H1. Specifically, an isolation material layer is formed to cover the entire top surface of the initial stacked structure 10' and inner surfaces (which includes the inner sidewall surfaces and bottom surfaces) of the pillar-shaped openings H1. Subsequently, portions of the isolation material layer which cover the top surface of the initial stacked structure 10' and the bottom surfaces of the pillar-shaped openings H1 are removed, and the portions of the isolation material layer covering the inner sidewall surfaces of the pillar-shaped openings H1 remain to form the barrier layers 20 shown in FIG. 5C. The material of the barrier layers 20 can be a conductive material, such as titanium nitride, tantalum nitride, tungsten nitride, iridium, platinum, palladium or any combination thereof.

Figure 5D:
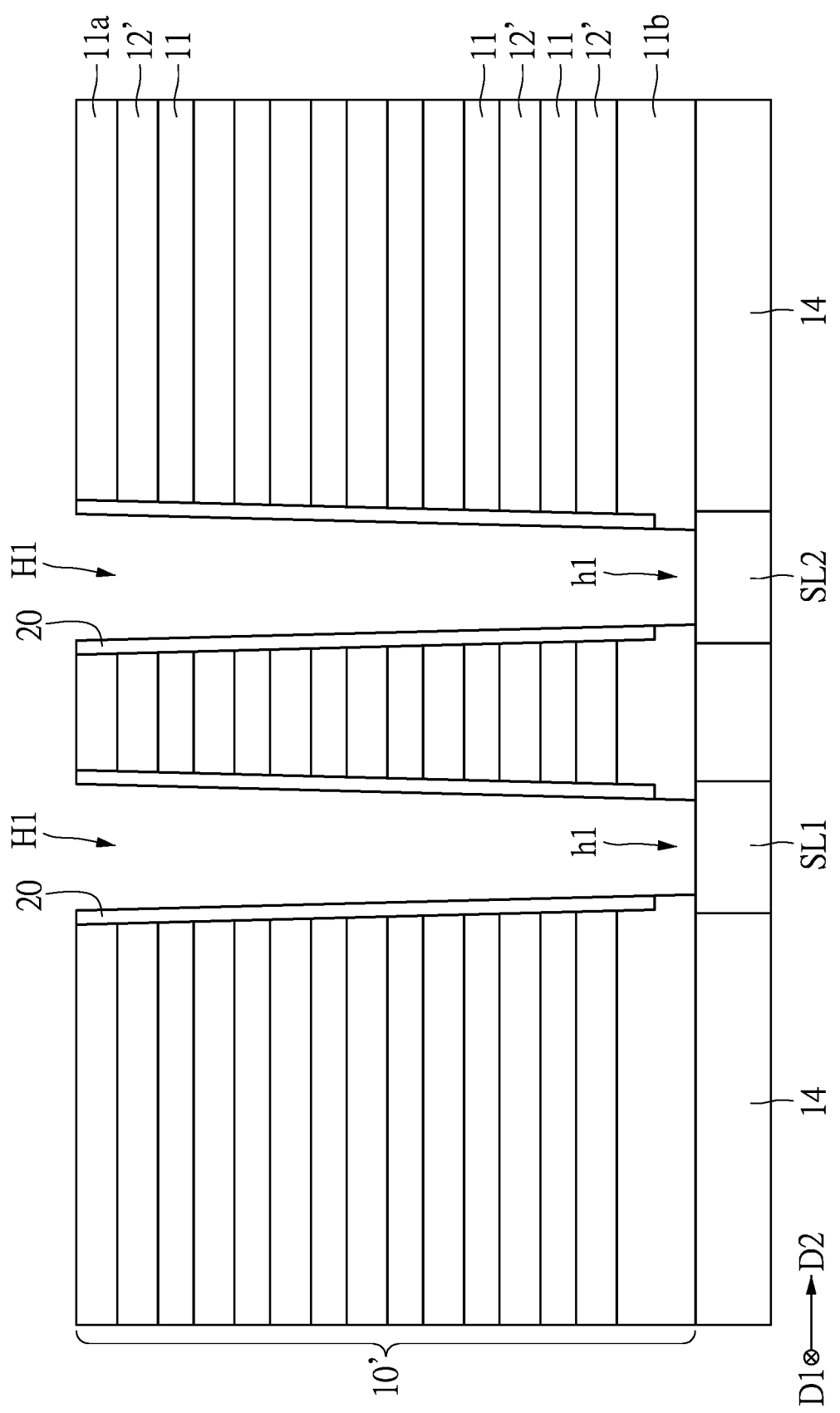
FIG. 5D is a partial sectional view of the three-dimensional memory device in step S102 of FIG. 3.

Reference is made to FIG. 5D. Subsequently, an etching step is performed by using the barrier layers 20 as a mask to form extending holes h1 at the bottom sides of the pillar-shaped openings H1. Specifically, portions of the insulating layer 11b beneath the pillar-shaped openings H1 are removed by the etching step so as to partially expose the corresponding bottom source lines SL1-SL2. Accordingly, each extending hole h1 extends from the bottom surface of the corresponding pillar-shaped opening H1 to a top surface of the corresponding bottom source line SL1 or SL2.

Figure 5E:
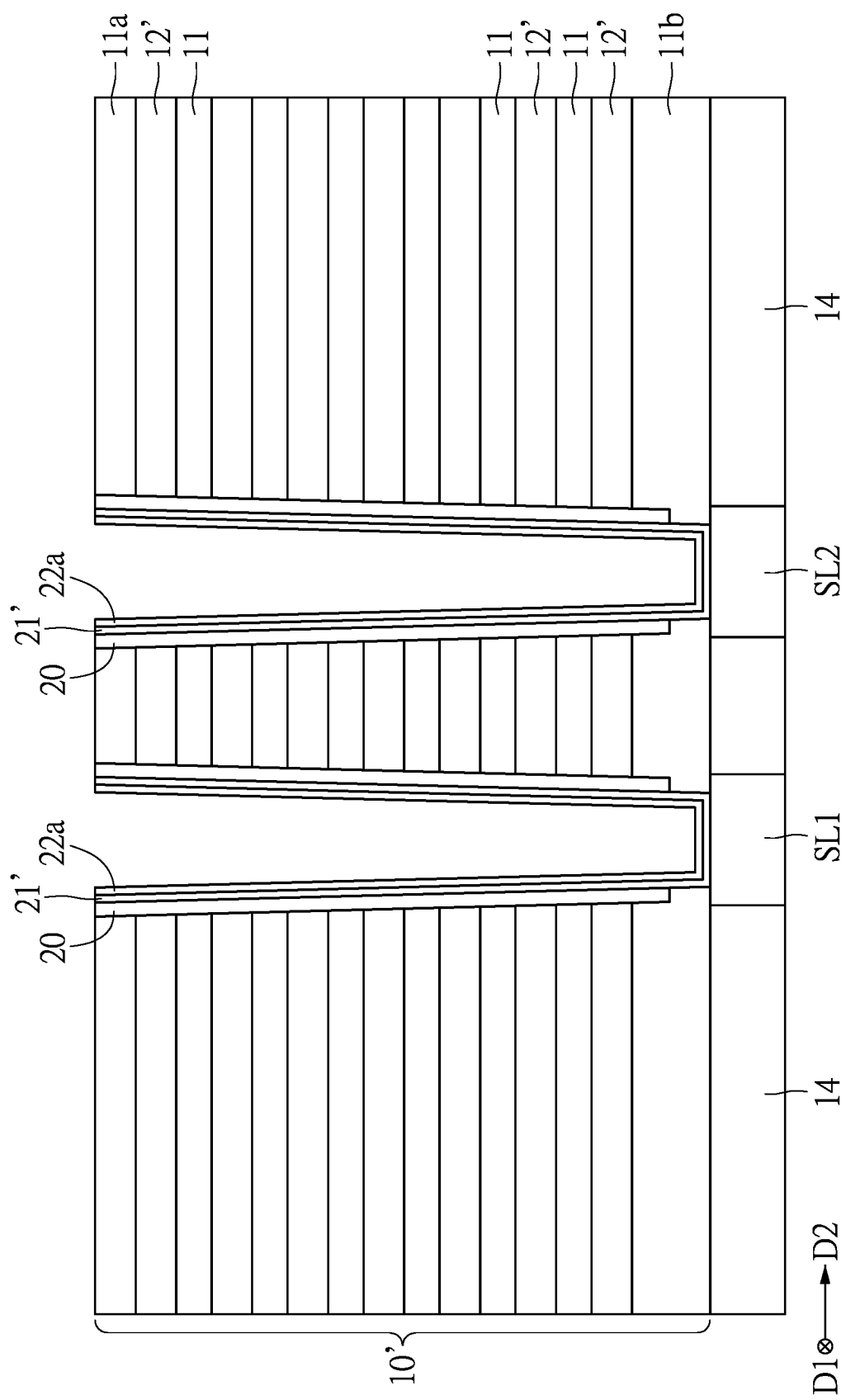
FIG. 5E is a partial sectional view of the three-dimensional memory device in step S102 of FIG. 3.

Subsequently, a pillar portion is formed in each of the pillar-shaped openings H1. Reference is made to FIG. 5E. An initial gate insulating layer 21' and an outer channel portion 22a are sequentially formed in each of the pillar-shaped openings H1 to form a tube-shaped stacked layer. Specifically, the initial gate insulating layer 21' and the outer channel portion 22a are formed on the inner sidewalls of the pillar-shaped openings H1 and the inner walls of the extending holes h1. Thereafter, a portion of the tube-shaped stacked layer located at the bottom of the extending hole h1 is removed. That is to say, only a portion of the initial gate insulating layer 21' and a portion of the outer channel layer 22a, which cover the bottom surface of the extending hole h1, are removed. In the instant embodiment, the outer channel layers 22a are made of polysilicon, and the initial gate insulating layers 21' are made of silicon oxide.

Figure 5F:
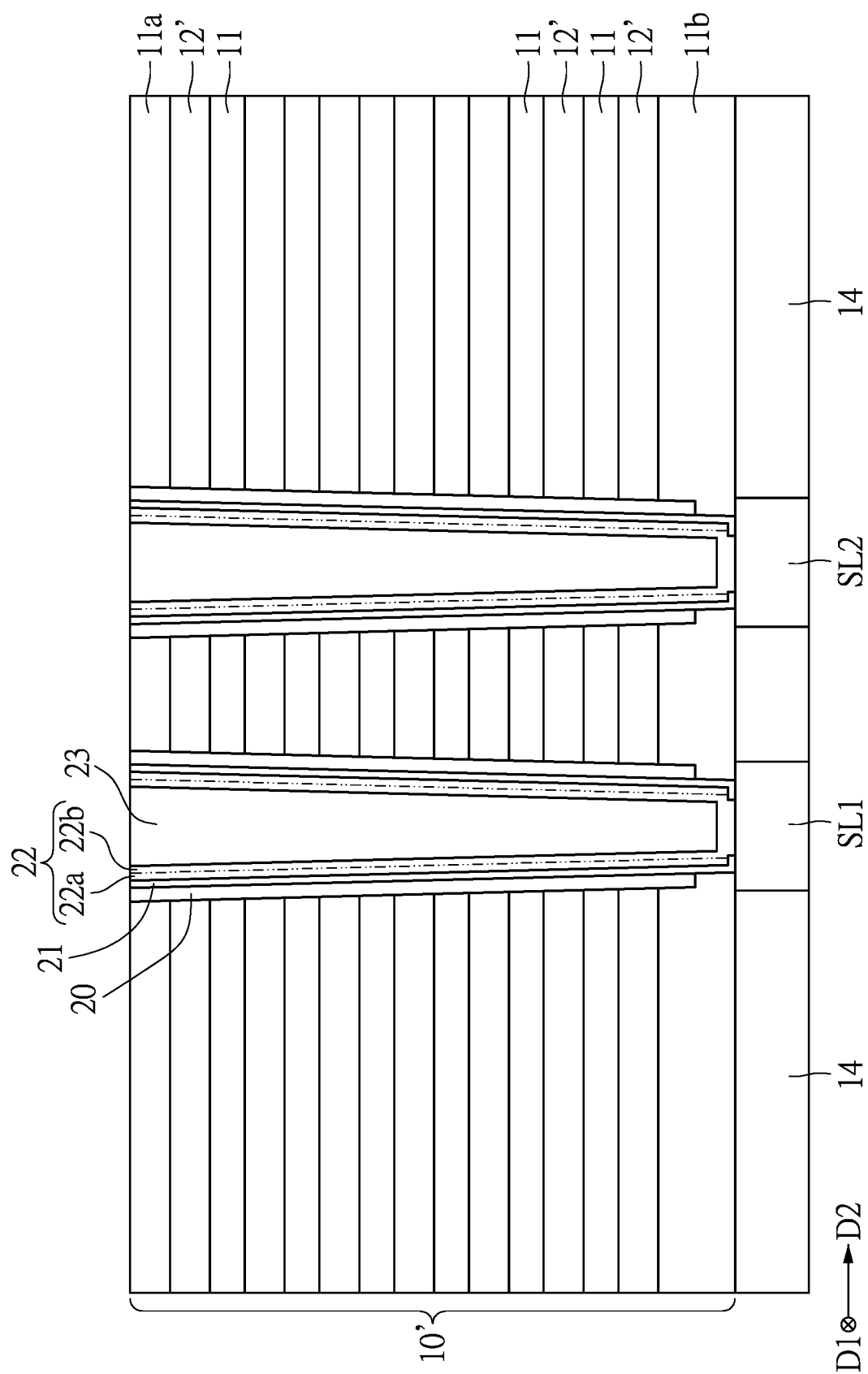
FIG. 5F is a partial sectional view of the three-dimensional memory device in step S102 of FIG. 3.

As shown in FIG. 5F, an inner channel portion 22b is formed in each of the pillar-shaped openings H1, and the inner channel portion 22b covers the tube-shaped stacked layer and the bottom of the extending hole h1. In each pillar-shaped opening H1, the outer channel portion 22a and the inner channel portion 22b jointly form a channel layer 22. To be more specific, the material of the inner channel layers 22b is the same as that of the outer channel layers 22a. Each channel layer 22 fabricated by the aforementioned steps will be in contact with the corresponding one of the bottom source lines SL1-SL2.

As shown in FIG. 5F, an insulation material is filled into remaining spaces of the pillar-shaped openings H1 to form a plurality of core insulating columns 23. To sum up, by performing the aforementioned steps, a pillar portion (not labelled) can be formed in each of the pillar-shaped openings H1. The pillar portion includes the gate insulating layer 21, the channel layer 22, and the core insulating column 23. The channel layer 22 can be in contact with the corresponding one of the bottom source lines SL1-SL2 through the extending hole h1.

Figure 5G:
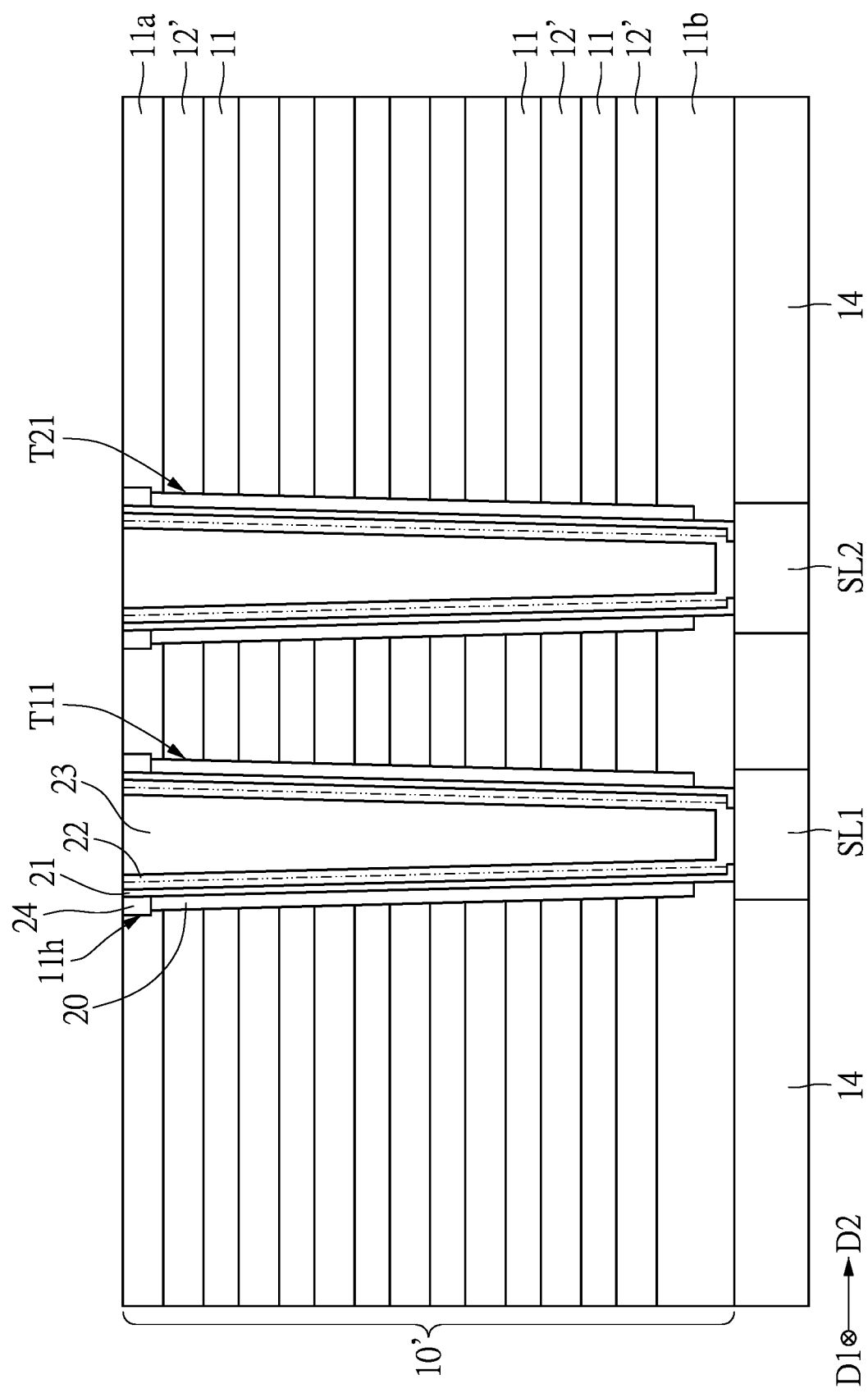
FIG. 5G is a partial sectional view of the three-dimensional memory device in step S102 of FIG. 3.

Reference is made to FIG. 5G. After the steps of forming the pillar portions, portions of the barrier layers 20 located at the top insulating layer 11a can be removed so as to form a plurality of loop-shaped openings 11h which respectively surround the pillar portions. Subsequently, an insulation material is filled in the loop-shaped openings 11h to form a plurality of loop-shaped insulating portions 24. As such, the barrier layers 20 can be insulated from the bit lines, which will be formed in the following step, by the corresponding loop-shaped insulating portions 24. In another embodiment, it is also workable to isolate the barrier layers 20 from the bit lines by using other insulating materials to cover the barrier layers, and thus the step of forming the loop-shaped insulating portions 24 can be omitted.

By performing the steps shown in FIG. 5A to FIG. 5G, the pillar structures T11-T23 passing through the initial stacked structure 10' can be fabricated. Each of the pillar structures T11-T23 includes the barrier layer 20, the gate insulating layer 21, the channel layer 22, and the core insulating column 23. Furthermore, as mentioned above, the channel layer 22 of each of the pillar structures T11-T23 is directly connected to the corresponding one of the bottom source lines SL1-SL2.

Figure 6B:
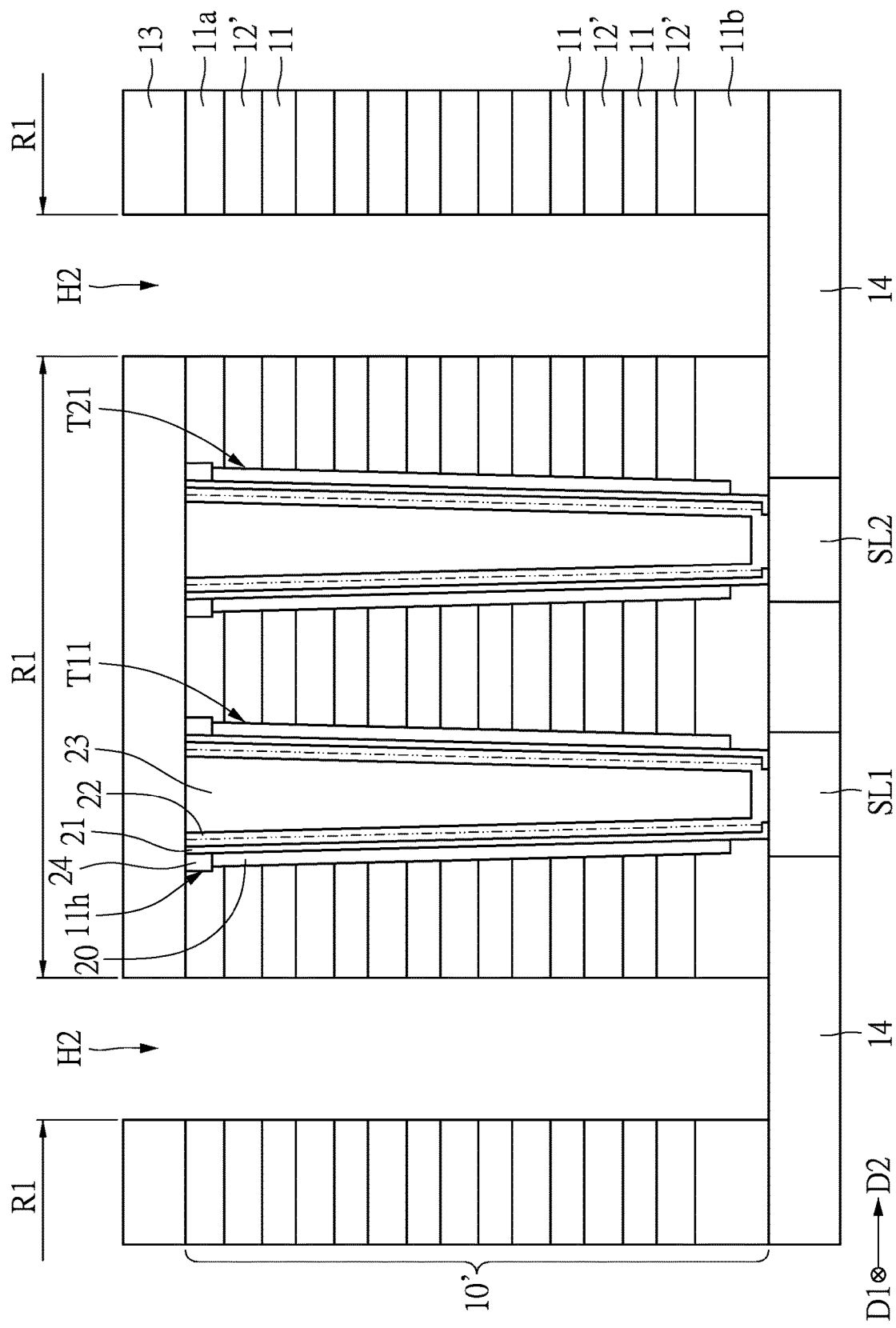
FIG. 6B is a partial sectional view of the three-dimensional memory device in step S103 of FIG. 3.

Reference is made to FIG. 6A to FIG. 6D, which correspond to the step S103 shown in FIG. 3. As shown in FIG. 6A, in the embodiment, before the step S103, a dielectric layer 13 can be formed first to cover the pillar structures T11-T23. The dielectric layer 13 may be an oxide layer, and the material of the dielectric layer 13 is different from that of the interlayers 12' in the initial stacked structure 10' to prevent the dielectric layer 13 from being removed during subsequent processes.

Figure 6C:
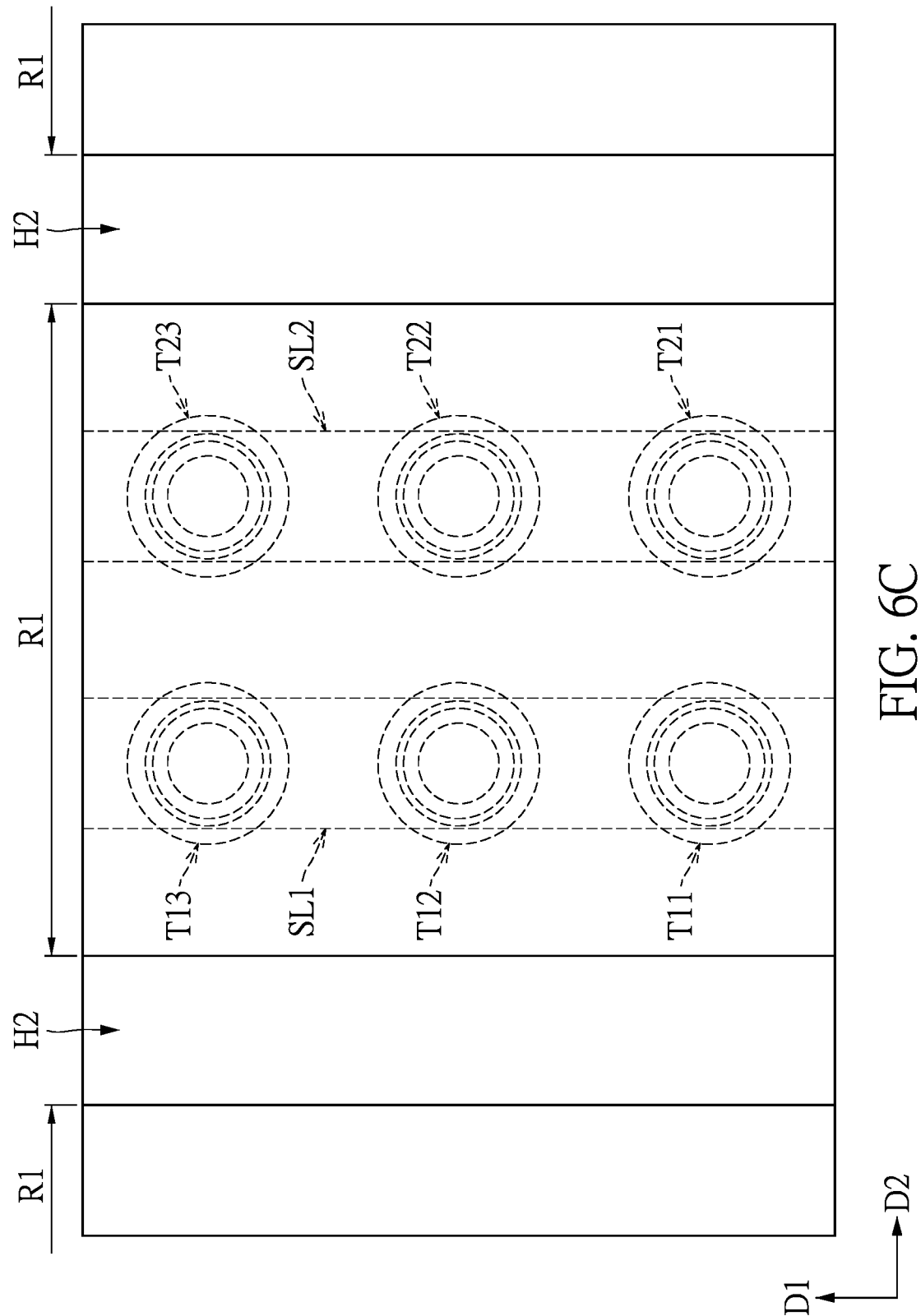
FIG. 6C is a partial top view of the three-dimensional memory device in step S103 of FIG. 3.

Reference is made to FIG. 6B and FIG. 6C, which respectively show a partial sectional view and a partial top view of the three-dimensional memory device in step S103 of FIG. 3.

As shown in FIG. 6C, a plurality of trenches H2 extending in the first horizontal direction D1 are formed in the initial stacked structure 10'. Only two trenches H2 shown in FIG. 6C are illustrated. Specifically, the trenches H2 are formed in the initial stacked structure 10' along predefined boundaries of the cell regions R1 so that the initial stacked structure 10' is divided into the cell regions R1 which are spaced apart from one another.

As shown in FIG. 6C, each of the trenches H2 of the embodiment extends from one side of the initial stacked structure 10' to another opposite side along the first horizontal direction D1. Furthermore, as shown in FIG. 6B, each of the trenches H2 extends from the top surface of the dielectric layer 13 to the bottom surface of the initial stacked structure 10'. As such, each of the interlayers 12' is partially exposed from the sidewall surface of the corresponding trench H2.

Figure 6D:
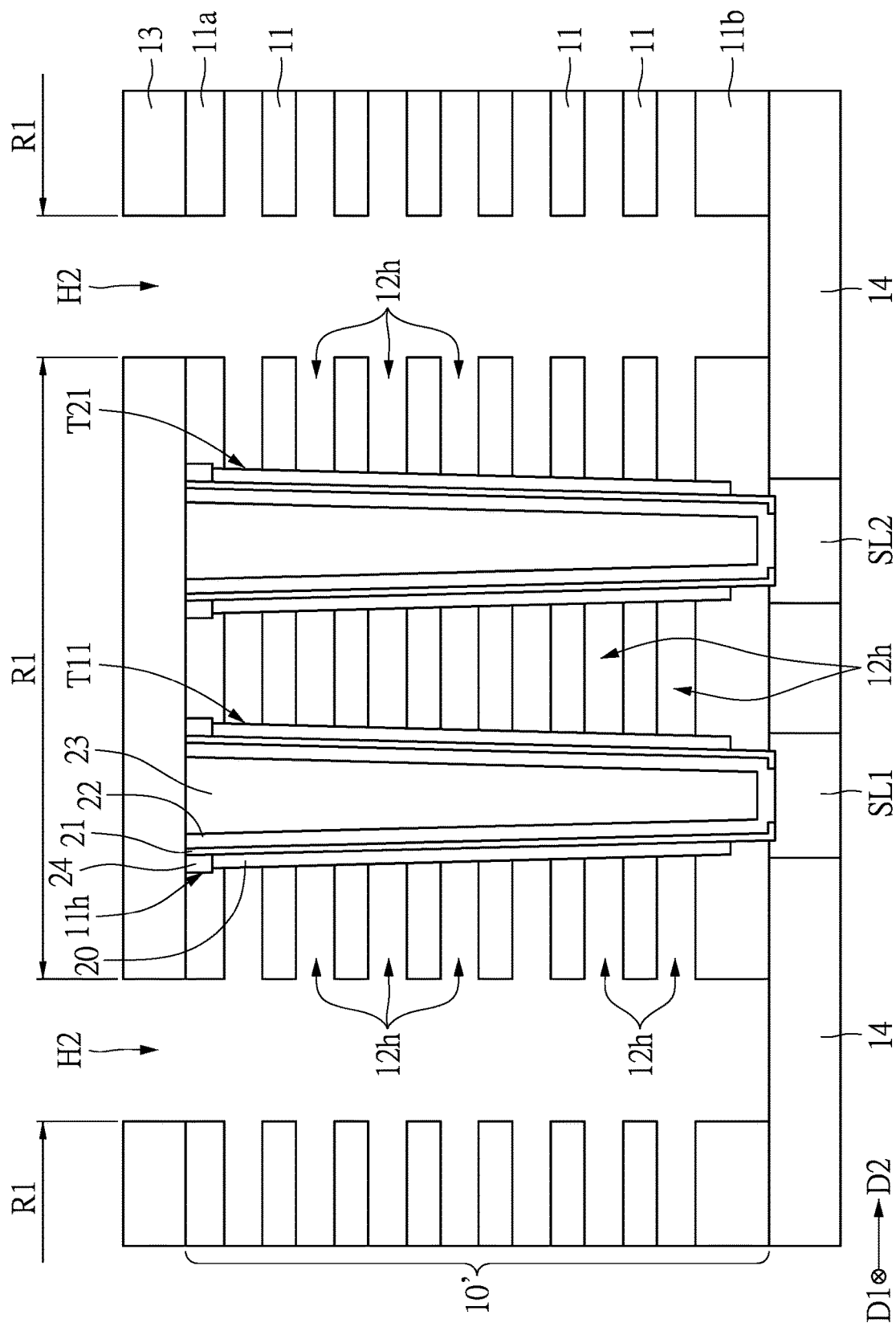
FIG. 6D is a partial sectional view of the three-dimensional memory device in step S103 of FIG. 3.

As shown in FIG. 6D, the interlayers 12' in the initial stacked structure 10' are removed. In the embodiment, since the material of the interlayers 12' is different from that of the insulating layers 11, the interlayers 12' can be selectively removed by performing a selective etching step such that the insulating layers 11 remain. In one embodiment, when the material of the interlayers 12' is silicon nitride, an etchant, such as phosphoric acid, can be used to remove the interlayers 12'.

As shown in FIG. 6D, after the interlayers 12' are removed, the insulating layers 11 and the pillar structures T11-T23 cooperatively define a plurality of spaces 12h. Each of the spaces 12h is defined by two adjacent insulating layers 11 and the neighboring one of the pillar structures T11-T23. It should be noted that, as shown in FIG. 6D, in one of the cell regions R1, each of the spaces 12h, which is defined by two adjacent insulating layers 11 (for example, the bottom insulating layer 11b and the adjacent insulating layer 11) and the neighboring one of the pillar structures T11-T23, is not blocked off by the neighboring pillar structure and allows a fluid (such as, a gas) to flow therein.

Furthermore, the spaces 12h which are respectively located at different levels in the same cell region R1 are separated from one another by the insulating layers 11, respectively. However, the spaces 12h are in spatial communication with one another by the trenches H2.

Figure 7A:
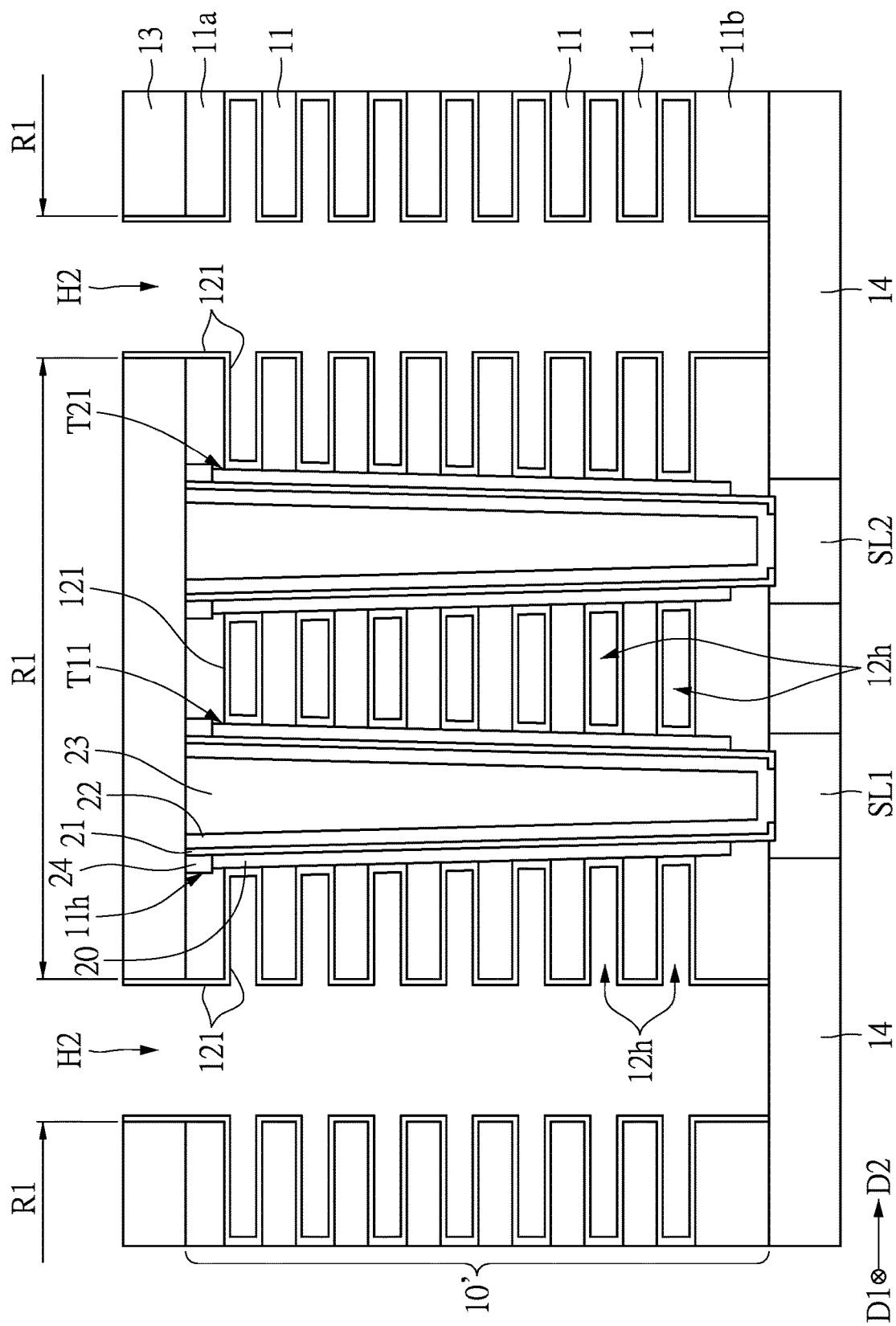
FIG. 7A is a partial sectional view of the three-dimensional memory device in step S104 of FIG. 3.

Reference is made to FIG. 7A to FIG. 7D, which correspond to the step S104 shown in FIG. 3. As shown in FIG. 7A, specifically, the step of forming the composite structures includes forming of ferroelectric layers 121 which cover the sidewalls of the trenches H2, the upper and lower surfaces of the insulating layers 11, and portions of the sidewall surfaces of the pillar structures T11-T23. The ferroelectric layers 121 can be formed by a chemical vapor deposition process.

Figure 7B:
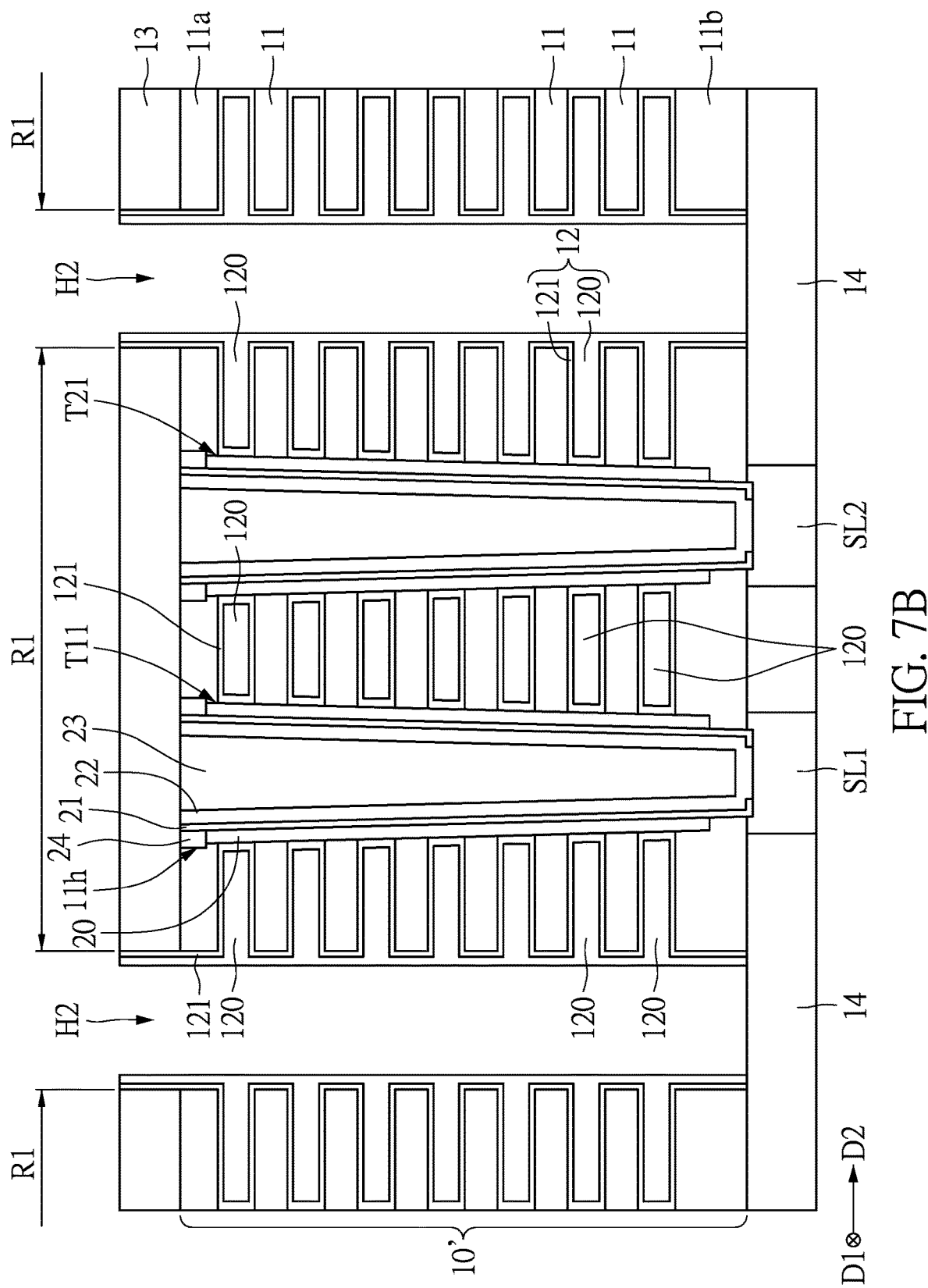
FIG. 7B is a partial sectional view of the three-dimensional memory device in step S104 of FIG. 3.

Reference is made to FIG. 7B. The gate conductive layers 120 are filled into the remaining spaces in the spaces 12h. It should be noted that the ferroelectric layer 121 that is formed in each space 12h defined between two adjacent insulating layers 11 only covers the upper surface of one of the insulting layer 11, the lower surface of the other insulating layer 11, and a portion of the sidewall surface of the neighboring one of the pillar structures T11-T23, but does not fill the entire space 12h. During the step of forming the gate conductive layers 120, the remaining spaces between two adjacent insulating layers 11 are filled with the gate conductive layers 120.

Figure 7C:
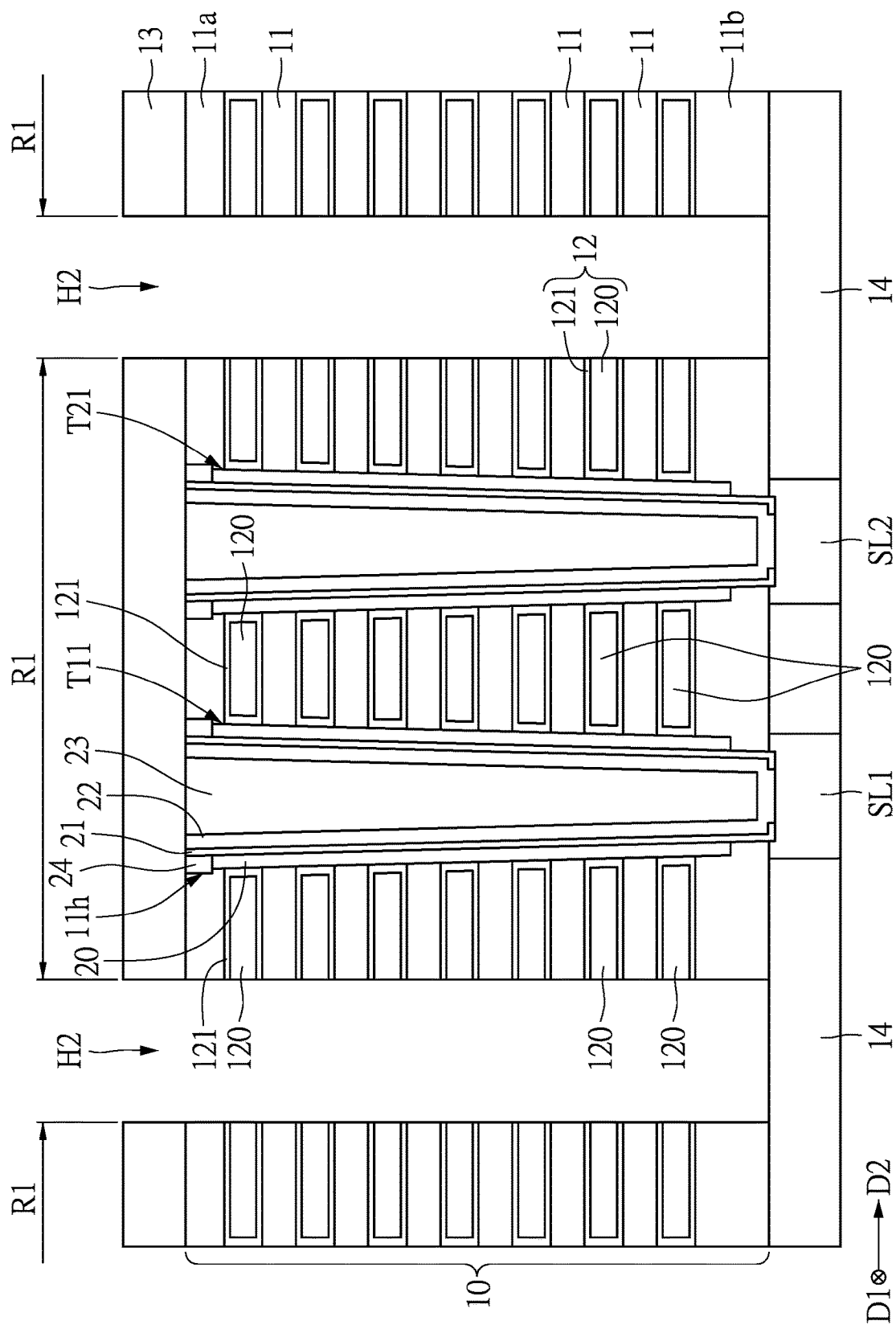
FIG. 7C is a partial sectional view of the three-dimensional memory device in step S104 of FIG. 3.

Reference is made to FIG. 7C. Subsequently, portions of the ferroelectric layers 121 and portions of the gate conductive layers 120, which cover the sidewalls of the trenches H2, are removed, such that one composite structure 12 is formed in each of the spaces 12h. Accordingly, the stacked structure 10 including the plurality of composite structures 12 can be fabricated. In other words, each of the composite structures 12 includes a gate conductive layer 120 and a ferroelectric layer 121 surrounding the gate conductive layer 120, and the ferroelectric layer 121 can be isolated from the gate insulating layer 21 by the barrier layer 20.

Figure 7D:
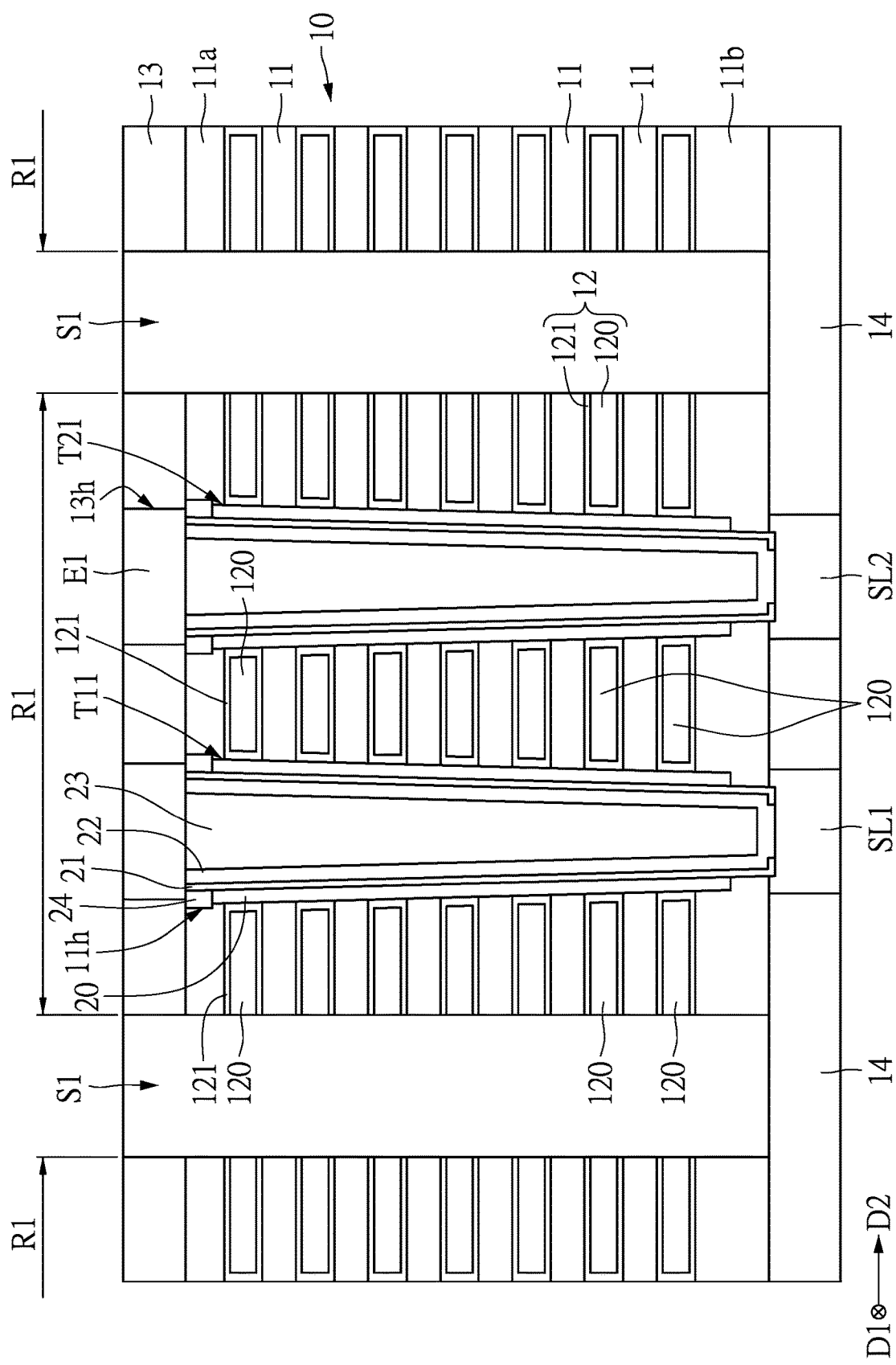
FIG. 7D is a partial sectional view of the three-dimensional memory device in step S104 of FIG. 3.

Reference is made to FIG. 7D. After the composite structures 12 are formed, an isolation material is filled in each of the trenches H2 so as to form an isolation portion S1 in each of the trenches H2.

Figure 8A:
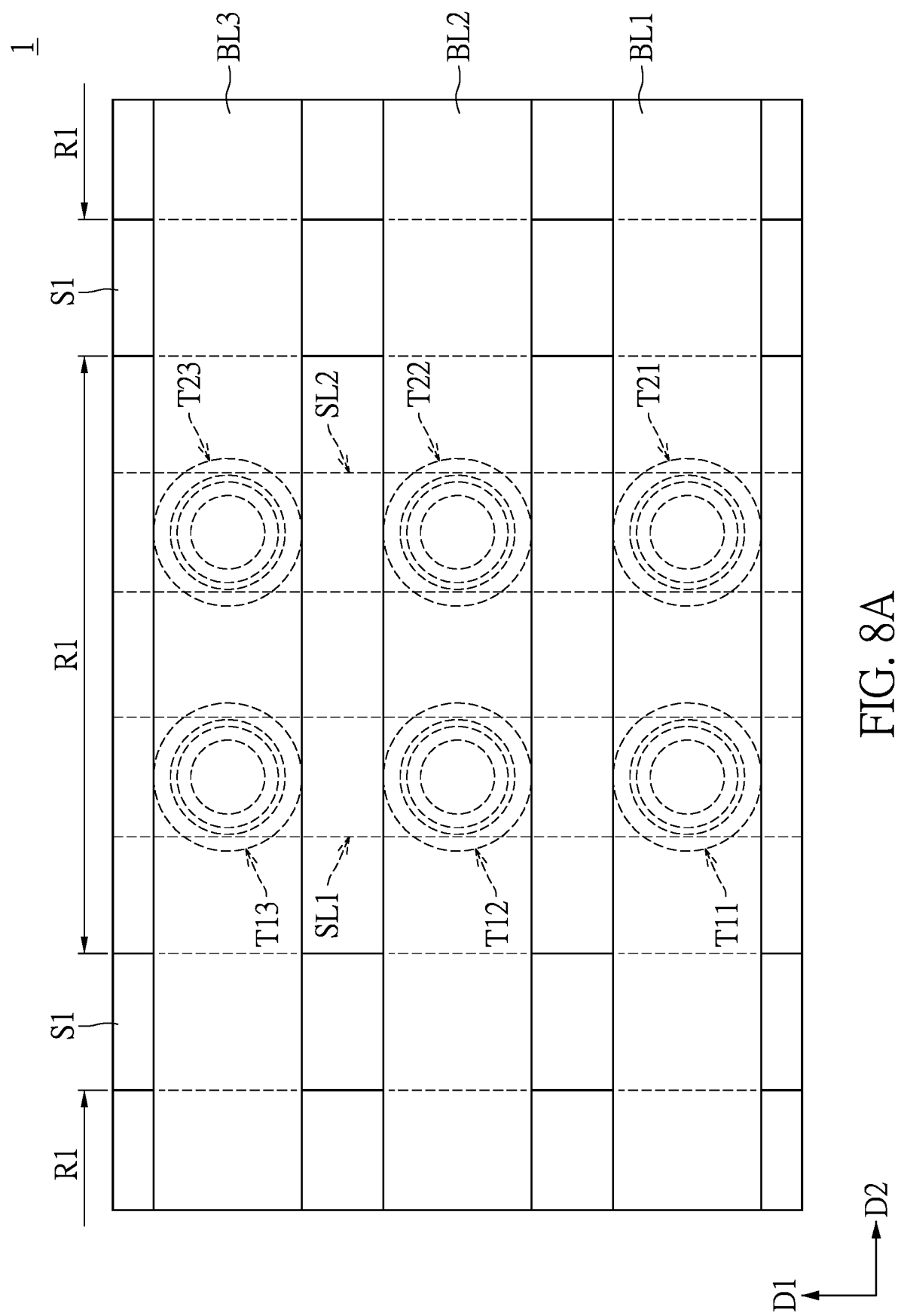
FIG. 8A is a partial top view of the three-dimensional memory device in step S105 of FIG. 3.
Figure 8B:
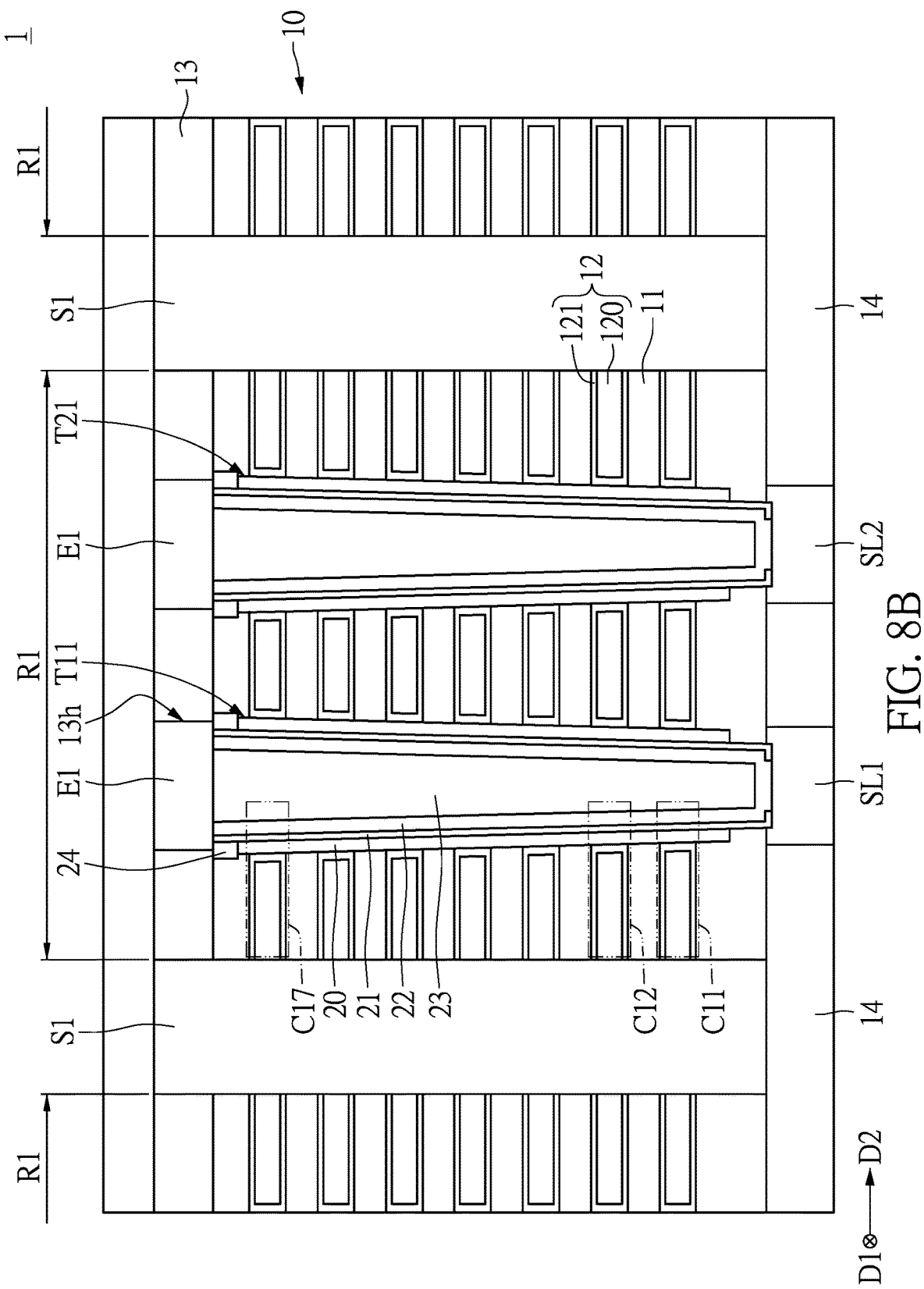
FIG. 8B is a partial sectional view of the three-dimensional memory device in step S105 of FIG. 3.

Reference is made to FIG. 8A and FIG. 8B, which correspond to the step S105 shown in FIG. 3. As shown in FIG. 8A, a plurality of the bit lines BL1-BL3 extending in the second horizontal direction D2 are formed on the stacked structure 10. Furthermore, each of the pillar structures T11-T23 is located at the corresponding one of the intersections where the bit lines BL1-BL3 extend across the bottom source lines SL1-SL2. Additionally, as shown in FIG. 8B, each of the pillar structures T11-T23 is connected between the corresponding one of the bit lines BL1-BL3 and the corresponding one of the bottom source lines SL1-SL2. To be more specific, the channel layer 22 of each of the pillar structures T11-T23 is electrically connected between the corresponding one of the bit lines BL1-BL3 and the corresponding one of the bottom source lines SL1-SL2.

In the embodiment, before the step of forming the bit lines BL1-BL3, a plurality of openings 13h respectively corresponding to the pillar structures T11-T23 are formed in the dielectric layer 13. Subsequently, a plurality of conductive portions E1 are formed respectively in the openings 13h, so that each of the bit lines BL1-BL3 can be electrically connected to the channel layers 22 of the corresponding pillar structures T11-T23.

In another embodiment, if the dielectric layer 13 is not formed in the prior steps, the bit lines BL1-BL3 will be directly formed on the top insulating layer 11a so as to be electrically connected to the channel layers 22 of the corresponding pillar structures T11-T23.

According to the manufacturing methods provided in the embodiments of the present disclosure, the three-dimensional memory device can be fabricated. Furthermore, each column of the composite structures 12 in the three-dimensional memory device 1 and the corresponding one of the pillar structures T11-T23 can jointly define the memory cells C11-C17, each of which has the MFMIS structure. Accordingly, the three-dimensional memory device 1 according to the embodiments of the present disclosure can function as a NAND flash memory.

In summary, one of the advantages of the present disclosure is that in the three-dimensional memory device 1 and the manufacturing method thereof, each of the pillar structures T11-T23 includes the barrier layer 20, the gate insulating layer 21, and the channel layer 22, and the ferroelectric layer 121 is isolated from the gate insulating layer 21 by the barrier layer 20. Accordingly, during the fabrication processes of the three-dimensional memory device 1, the barrier layer 20 can prevent atoms in the gate insulating layer 21 from diffusing into the ferroelectric layer 121, and then influence on the ferroelectric characteristic of the ferroelectric layer 121 can be avoided. Furthermore, the three-dimensional memory device 1 of the embodiment in the present disclosure includes the memory cells C11-C17 which are vertically stacked and connected in series, such that the data storage capacity per unit area can be increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A three-dimensional memory device comprising:
  a plurality of bottom source lines extending in a first horizontal direction;
  a stacked structure disposed on the bottom source lines, wherein the stacked structure includes a plurality of composite structures which are spaced apart from one another and respectively located at different levels, each of the composite structures includes a gate conductive layer and a ferroelectric layer surrounding the gate conductive layer;
  a plurality of bit lines disposed on the stacked structure and extending in a second horizontal direction, wherein the bit lines traverse the bottom source lines; and
  a plurality of pillar structures passing through the stacked structure, wherein each of the pillar structures is connected between the corresponding bit line and the corresponding bottom source line, and each of the composite structures and the corresponding one of the pillar structures define a memory cell;
  wherein each of the pillar structures includes a barrier layer, a gate insulating layer, and a channel layer, and each of the ferroelectric layers and the corresponding one of the gate insulating layers are insulated from each other by the corresponding one of the barrier layers.

2. The three-dimensional memory device according to claim 1, wherein the barrier layer is an outermost layer in each of the pillar structures, each of the pillar structures further includes a core insulation column, and the channel layer is interposed between the core insulation column and the gate insulating layer.

3. The three-dimensional memory device according to claim 1, wherein the barrier layer is made of a conductive material and insulated from both of the corresponding bit line and the corresponding bottom source line.

4. The three-dimensional memory device according to claim 3, wherein each of the channel layers has two ends respectively connected to the corresponding bottom source line and the corresponding bit line.

5. The three-dimensional memory device according to claim 1, wherein the stacked structure includes a plurality of insulating layers, and each of the composite structures is disposed in a space defined by two adjacent insulating layers.

6. The three-dimensional memory device according to claim 5, wherein the ferroelectric layer of each of the composite structures conformingly covers a part of a sidewall surface of the corresponding one of the pillar structures, an upper surface of one of the adjacent insulating layers, and a lower surface of the other one of the adjacent insulating layers.

7. The three-dimensional memory device according to claim 1, further comprising a dielectric layer disposed on the top of the stacked structure, being in contact with the bit lines, and having a plurality of openings respectively corresponding to the pillar structures, wherein each of the bit lines has a plurality of conductive portions respectively filled in the openings to be electrically connected to the corresponding the pillar structures.

8. The three-dimensional memory device according to claim 1, wherein the ferroelectric layer is made of a material including a ferroelectric material and dopants, the ferroelectric material is hafnium oxide, hafnium zirconium oxide, hafnium silicon oxide or zirconium titanium oxide, and the dopants are silicon, aluminum, lanthanum, yttrium, strontium, gadolinium, niobium, nickel, tantalum, or any combination thereof.

9. The three-dimensional memory device according to claim 1, wherein the stacked structure has a cell region, the pillar structures are arranged in the cell region;
  wherein the three-dimensional memory device includes two isolation portions respectively located at two opposite sides of the cell region, and each of the isolation portions extends from a top surface of the stacked structure to a bottom surface of the stacked structure.

* * * * *

UNITED STATES PATENT AND TRADEMARK OFFICE
CERTIFICATE OF CORRECTION

Page 1 of 1

PATENT NO. : 10,777,578 B2
APPLICATION NO. : 16/161856
DATED : September 15, 2020
INVENTOR(S) : Fu-Chou Liu It is certified that error appears in the above-identified patent and that said Letters Patent is hereby corrected as shown below:

On the Title Page

Item (71) Applicant should read: NuStorage Technology Co., Ltd., Apia, WS

Signed and Sealed this
Ninth Day of March, 2021

Drew Hirshfeld
*Performing the Functions and Duties of the
Under Secretary of Commerce for Intellectual Property and
Director of the United States Patent and Trademark Office*